US012688405B2

(12) United States Patent
Fernando et al.

(10) Patent No.: US 12,688,405 B2
(45) Date of Patent: Jul. 21, 2026

(54) ANALOG NEUROMOPRHIC CIRCUIT WITH STACKS OF RESISTIVE MEMORY CROSSBAR CONFIGURATIONS

(71) Applicant: University of Dayton, Dayton, OH (US)

(72) Inventors: B. Rasitha Fernando, Winston Salem, NC (US); Tarek M. Taha, Centerville, OH (US); Chris Yakopcic, Dayton, OH (US); Yangjie Qi, Dayton, OH (US)

(73) Assignee: University of Dayton, Dayton, OH (US)

( * ) Notice: Subject to any disclaimer, the term of this patent is extended or adjusted under 35 U.S.C. 154(b) by 938 days.

(21) Appl. No.: 17/872,626

(22) Filed: Jul. 25, 2022

(65) Prior Publication Data

US 2023/0028592 A1    Jan. 26, 2023

Related U.S. Application Data

(60) Provisional application No. 63/225,294, filed on Jul. 23, 2021.

(51) Int. Cl.
*G06N 3/065* (2023.01)
*G11C 11/54* (2006.01)
*G11C 13/00* (2006.01)

(52) U.S. Cl.
CPC .............. *G06N 3/065* (2023.01); *G11C 11/54* (2013.01); *G11C 13/003* (2013.01); *G11C 2213/71* (2013.01)

(58) Field of Classification Search
CPC ...... G06N 3/065; G11C 11/54; G11C 13/003; G11C 2213/71
See application file for complete search history.

(56) References Cited

U.S. PATENT DOCUMENTS 7,575,973 B2    8/2009  Mokhlesi et al.
8,812,415 B2    8/2014  Modha
(Continued)

FOREIGN PATENT DOCUMENTS

KR        20190075682 A        7/2019

OTHER PUBLICATIONS

Fernando, B. Rasitha, et al. "3D memristor crossbar architecture for a multicore neuromorphic system." 2020 International Joint Conference on Neural Networks (IJCNN). IEEE, Jul. 19, 2020. (Year: 2020).*

(Continued)

*Primary Examiner* — Randall K. Baldwin
(74) *Attorney, Agent, or Firm* — Taft Stettinius & Hollister LLP

(57)        ABSTRACT

An analog neuromorphic circuit is disclosed having a resistive memory crossbar configurations positioned in the analog neuromorphic circuit forming a 3D stack. Input voltages are applied to an input selector unit that selects a first selected resistive memory crossbar configuration that the input voltages are applied. Output voltages are generated by the first selected resistive memory crossbar configuration from a propagation of the input voltages through resistive memories positioned on the first selected resistive memory crossbar configuration. An output selector unit selects the first selected resistive memory crossbar configuration that generates the output voltages. Each output voltage corresponds to an output of the first selected resistive memory crossbar configuration as selected by the output selector. An activation function unit receives the output voltages generated from the first selected memory crossbar configuration and executes a function based on the output voltages received from the first selected resistive memory crossbar configuration.

22 Claims, 9 Drawing Sheets

(56) References Cited

U.S. PATENT DOCUMENTS

| | | | |
|---|---|---|---|
| 9,093,369 | B2 | 7/2015 | Shin et al. |
| 9,570,683 | B1 | 2/2017 | Jo et al. |
| 9,646,243 | B1 | 5/2017 | Gokmen |
| 9,853,053 | B2 | 12/2017 | Lupino et al. |
| 10,014,318 | B2 | 7/2018 | Or-Bach et al. |
| 10,355,121 | B2 | 7/2019 | Or-Bach et al. |
| 10,817,778 | B2 | 10/2020 | Baughman et al. |
| 11,055,603 | B2 | 7/2021 | Park et al. |
| 2018/0075339 | A1* | 3/2018 | Ma ........................... G06N 3/04 |
| 2018/0095930 | A1* | 4/2018 | Lu ...................... G11C 13/0002 |
| 2020/0145008 | A1* | 5/2020 | Strukov ............. G11C 16/0425 |
| 2022/0027723 | A1* | 1/2022 | Kolter ...................... G06N 3/08 |
| 2022/0366211 | A1* | 11/2022 | Ma ......................... G06N 3/082 |

OTHER PUBLICATIONS

Chakraborty, Indranil, et al. "Resistive crossbars as approximate hardware building blocks for machine learning: Opportunities and challenges." Proceedings of the IEEE 108.12 (2020): 2276-2310. (Year: 2020).*

Soudry, Daniel, et al. "Memristor-based multilayer neural networks with online gradient descent training." IEEE transactions on neural networks and learning systems 26.10 (2015): 2408-2421. (Year: 2015).*

Jain, Shubham, et al. "Neural network accelerator design with resistive crossbars: Opportunities and challenges." IBM Journal of Research and Development 63.6 (2019): 10-1. (Year: 2019).*

Jain, Shubham, et al. "RxNN: A Framework for Evaluating Deep Neural Networks on Resistive Crossbars." arXiv preprint arXiv: 1809.00072 v3 (Jun. 2020). (Year: 2020).*

Qi, Yangjie, Raqibul Hasan, Rasitha Fernando, and Tarek Taha. "Socrates-D: Multicore Architecture for On-Line Learning." In 2017 IEEE International Conference on Rebooting Computing (ICRC), pp. 1-8. IEEE, 2017.

Hasan, Raqibul, Tarek M. Taha, and Chris Yakopcic. "On-chip training of memristor based deep neural networks." In 2017 International Joint Conference on Neural Networks (IJCNN), pp. 3527-3534. IEEE, 2017.

Krestinskaya, Olga, Khaled Nabil Salama, and Alex Pappachen James. "Learning in memristive neural network architectures using analog backpropagation circuits." IEEE Transactions on Circuits and Systems I: Regular Papers 66, No. 2 (2018): 719-732.

L. O. Chua, "Memristor—The Missing Circuit Element," IEEE Transactions on Circuit Theory, vol. 18, No. 5, pp. 507-519 (1971).

T. M. Taha, R. Hasan, C. Yakopcic, and M. R. McLean, "Exploring the Design Space of Specialized Multicore Neural Processors," IEEE/INNS International Joint Conference on Neural Networks (IJCNN), pp. 1-8, Dallas, TX, Aug. 2013.

Adam, Gina C., Brian D. Hoskins, Mirko Prezioso, Farnood Merrikh-Bayat, Bhaswar Chakrabarti, and Dmitri B. Strukov. "3-D memristor crossbars for analog and neuromorphic computing applications." IEEE Transactions on Electron Devices 64, No. 1 (2016): 312-318.

Yakopcic and T. M. Taha, "Analysis and Design of Memristor Crossbar Based Neuromorphic Intrusion Detection Hardware," IEEE/INNS International Joint Conference on Neural Networks (IJCNN), pp. 1-7, Rio de Janeiro, Brazil, Jul. 2018.

Zokaee, F., Zhang, M., Ye, X., Fan, D., & Jiang, L. (Jun. 2019). Magma: A monolithic 3d vertical heterogeneous reram-based main memory architecture. In 2019 56th ACM/IEEE Design Automation Conference (DAC), (pp. 1-6). IEEE.

* cited by examiner

ANALOG NEUROMOPRHIC CIRCUIT WITH STACKS OF RESISTIVE MEMORY CROSSBAR CONFIGURATIONS

CROSS-REFERENCE TO RELATED APPLICATIONS

The present application is a U.S. Nonprovisional Application of U.S. Provisional Application Ser. No. 63/225,294 filed Jul. 23, 2021, the disclosure of which is incorporated by reference in its entirety.

FIELD OF THE INVENTION

This invention relates to neural networks, and more particularly, to systems and methods for implementing resistive memories in an analog neuromorphic circuit.

BACKGROUND OF THE INVENTION

Traditional computing systems use conventional microprocessor technology in that operations are performed in chronological order such that each operation is completed before the subsequent operation is initiated. The operations are not performed simultaneously. For example, an addition operation is completed before the subsequent multiplication operation is initiated. The chronological order of operation execution limits the performance of conventional microprocessor technology. Conventional microprocessor design is limited in how small the microprocessors can be designed, the amount of power that the microprocessors consume, as well as the speed in which the microprocessors execute operations in chronological order. Thus, conventional microprocessor technology is proving insufficient in applications that require significant computational efficiency, such as in image recognition.

It is becoming common wisdom to use conventional neuromorphic computing networks which are laid out in a similar fashion as the human brain. Hubs of computing power are designed to function as a neuron in the human brain where different layers of neurons are coupled to other layers of neurons. This coupling of neurons enables the neuromorphic computing network to execute multiple operations simultaneously. Therefore, the neuromorphic computing network has exponentially more computational efficiency than traditional computing systems.

Conventional neuromorphic computing networks are implemented in large scale computer clusters which include computers that are physically large in order to attain the computational efficiency necessary to execute applications such as image recognition. For example, applications of these large scale computer clusters include rows and rows of physically large servers that may attain the computational efficiency necessary to execute image recognition when coupled together to form a conventional neuromorphic computing network. Such large scale computer clusters not only take up a significant amount of physical space but also require significant amounts of power to operate.

The significant amount of physical space and power required to operate conventional neuromorphic computing networks severely limits the types of applications for which conventional neuromorphic computing networks may be implemented. For example, industries such as biomedical, military, robotics, and mobile devices are industries that cannot implement conventional neuromorphic computing networks due to the significant space limitations in such industries as well as the power limitations. Therefore, an effective means to decrease the space and the power required by conventional neuromorphic computing is needed.

SUMMARY OF THE INVENTION

The present invention provides an analog neuromorphic circuit that implements a plurality of resistive memories. The analog neuromorphic circuit includes a plurality of resistive memory crossbar configurations with each resistive memory crossbar configuration positioned in the analog neuromorphic circuit in a stack thereby forming a three-dimensional (3D) stack of the plurality of resistive memory crossbar configurations. A plurality of input voltages is applied to an input selector unit and the input selector unit selects a first selected resistive memory crossbar configuration that the plurality of input voltages is to be applied. Each input voltage corresponds to a corresponding input of the first selected resistive memory crossbar configuration positioned in the 3D stack as first selected by the input selector. A plurality of output voltages is generated by the first selected resistive memory crossbar configuration from a propagation of the input voltages through a plurality of resistive memories positioned on the first selected resistive memory crossbar configuration. An output selector unit selects the first selected resistive memory crossbar configuration that the plurality of output voltages is generated from. Each output voltage corresponds to a corresponding output of the first selected resistive memory crossbar configuration positioned in the 3D stack as selected by the output selector. An activation function unit receives the plurality of output voltages generated from the first selected memory crossbar configuration and executes a function based on the plurality of output voltages received from the first selected resistive memory crossbar configuration.

The present invention also provides a method for implementing a three-dimensional (3D) stack of a plurality resistive memory crossbar configurations into an analog neuromorphic circuit. The method starts with providing a plurality of resistive memory crossbar configurations with each resistive memory crossbar configuration positioned into the analog neuromorphic circuit in a stack thereby forming the 3D stack of the plurality of resistive memory crossbar configurations. A plurality of output voltages is applied to an input selector unit. The input selector unit selects a first selected resistive memory crossbar configuration that the plurality of input voltages is applied. Each input voltage corresponds to a corresponding input of the first selected resistive memory crossbar configuration positioned in the 3D stack as first selected by the input selector. A plurality of output voltages is generated by the first selected resistive memory crossbar configuration from a propagation of the input voltages through a plurality of resistive memories positioned on the first selected resistive memory crossbar configuration. An output selector selects the first selected resistive memory crossbar configuration that the plurality of output voltages is generated from. Each output voltage corresponds to a corresponding output of the first selected resistive memory crossbar configuration positioned in the 3D stack as selected by the output selector. An activation unit receives the plurality of output voltages generated from the first selected memory crossbar configuration. A function is executed based on the plurality of output voltages received from the first selected memory crossbar configuration.

The present invention also provides an analog neuromorphic circuit that implements a plurality of resistive memories. The analog neuromorphic circuit includes a plurality of processing cores with each processing core including a plurality of resistive memory crossbar configurations with each corresponding resistive memory crossbar configuration positioned in each corresponding resistive memory crossbar configuration positioned in each corresponding processing core in a stack thereby forming a three-dimensional (3D) stack of a plurality of resistive memory crossbar configurations included in each corresponding processing core. A plurality of input selector units with each input selector unit shared by a corresponding processing core and each input selector unit selects a selected resistive memory crossbar configuration positioned in each corresponding processing core that a plurality of input voltages is to be applied. A plurality of output selector units with each output selector unit shared by a corresponding processing core and each output selector unit selects the selected resistive crossbar configuration positioned in each corresponding processing core that a plurality of output voltages is generated. A plurality of activation units with activation unit shared by a corresponding processing core and each activation unit receives the plurality of output voltages generated from each corresponding selected resistive crossbar configuration and executes a function based on the plurality of output voltages received from the corresponding selected resistive memory crossbar configuration.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

DETAILED DESCRIPTION

Figure 1:
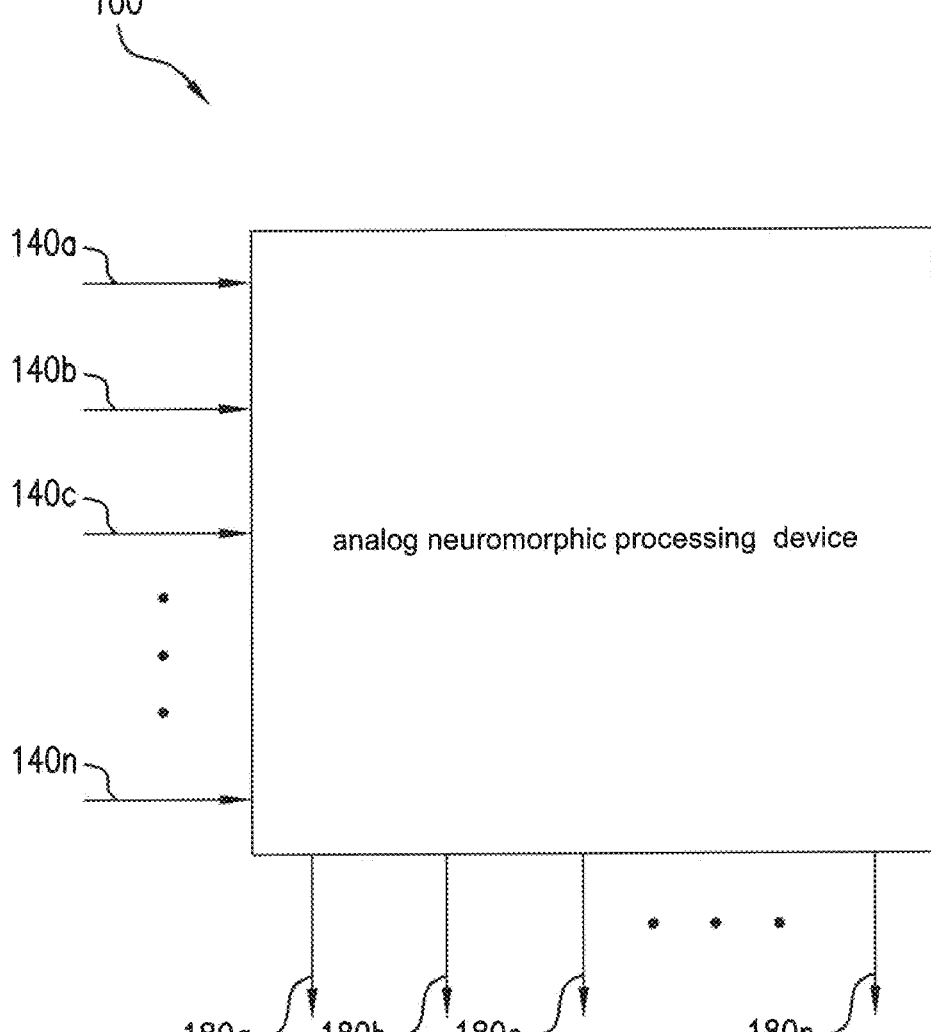
FIG. 1 is a schematic illustration of an exemplary analog neuromorphic processing device that simultaneously executes several computing operations in parallel in accordance with an embodiment of the disclosure.

The following Detailed Description refers to accompanying drawings to illustrate exemplary embodiments consistent with the present disclosure. References in the Detailed Description to "one embodiment," "an embodiment," "an exemplary embodiment," etc., indicate that the exemplary embodiment described can include a particular feature, structure, or characteristic, but every exemplary embodiment does not necessarily include the particular feature, structure, or characteristic. Moreover, such phrases are not necessarily referring to the same embodiment. Further, when a particular feature, structure, or characteristic is described in connection with an embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other embodiments are possible, and modifications can be made to exemplary embodiments within the scope of the present disclosure. Therefore, the Detailed Description is not meant to limit the present disclosure. Rather, the scope of the present disclosure is defined only in accordance with the following claims and their equivalents.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

For purposes of this discussion, each of the various components discussed may be considered a module, and the term "module" shall be understood to include at least one of software, firmware, and hardware (such as one or more circuit, microchip, or device, or any combination thereof), and any combination thereof. In addition, it will be understood that each module may include one, or more than one, component within an actual device, and each component that forms a part of the described module may function either cooperatively or independently of any other component forming a part of the module. Conversely, multiple modules described herein may represent a single component within an actual device. Further, components within a module may be in a single device or distributed among multiple devices in a wired or wireless manner.

The following Detailed Description of the exemplary embodiments will so fully reveal the general nature of the present disclosure that others can, by applying knowledge of those skilled in the relevant art(s), readily modify and/or adapt for various applications such exemplary embodiments, without undue experimentation, without departing from the scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not limitation, such that the terminology or phraseology of the present specification is to be interpreted by those skilled in relevant art(s) in light of the teachings herein.

The present invention creates an analog neuromorphic computing network by implementing resistive memories. A resistive memory is a non-volatile, variable resistor that may not only change the resistance level but may also maintain the resistance level after power to the resistive memory has been terminated so that the resistive memory acts as memory. A combination of resistive memories may generate output values that may be positive and/or negative. Such characteristics of the resistive memory enables neuromorphic computing to be shrunk down from implementing large computers to a circuit that can be fabricated onto a chip while requiring minimal power due to the analog characteristics of the resistive memory.

The resistive memories may be positioned in a crossbar configuration in that each resistive memory is positioned at an intersection of a plurality of horizontal wires and a plurality of vertical wires forming a wire grid. An input voltage may be applied to each horizontal wire. Each resistive memory may apply a resistance to each input voltage so that each input voltage is multiplied by each resistance. The positioning of each resistive memory at each intersection of the wire grid enables the multiplying of each input voltage by the resistance of each resistive memory to be done in parallel. The multiplication in parallel enables multiple multiplication operations to be executed simultaneously. Each current relative to each horizontal wire may then be added to generate an accumulative current that is conducted by each vertical wire. The addition of each current to generate the accumulative currents is also done in parallel due to the positioning of the resistive memories at each intersection of the wire grid. The addition in parallel also enables multiple addition operations to be executed simultaneously. The simultaneous execution of addition and multiplication operations in an analog circuit generates significantly more computational efficiency than conventional microprocessors while implementing significantly less power than conventional microprocessors.

The terms "horizontal" and "vertical" are used herein for ease of discussion to refer to one example of the invention. It should be understood however that such orientation is not required, nor is a perpendicular intersection required. It is sufficient that a plurality of parallel wires intersects a pair of parallel wires to form a crossbar or grid pattern having two wires for adding current and two or more wires for inputting voltages, with a resistive memory positioned at each intersection for multiplication. The intersections may occur at right angles (orthogonal crossing lines) or non-right angles. It may be understood, however, that the orthogonal arrangement provides the simplest means for scaling the circuit to include additional neurons and/or layers of neurons. Further, it may be understood than an orientation having horizontal rows and/or vertical columns is also simpler for scaling purposes and is a matter of the point of reference, and should not be considered limiting. Thus, any grid configuration orientation is contemplated.

Referring to FIG. 1, an analog neuromorphic processing device 100 simultaneously executes several computing operations in parallel. The analog neuromorphic processing device 100 includes a plurality of input voltages 140($a$-$n$) that are applied to a plurality of respective inputs of the analog neuromorphic processing device 100 and the analog neuromorphic processing device 100 then generates a plurality of output signals 180($a$-$n$).

The analog neuromorphic processing device 100 may include a plurality of resistive memories (not shown) that have variable resistance characteristics that may be exercised not only with low levels of power but may also exercise those variable resistance characteristics after power applied to the resistive memories has been terminated. The variable resistance characteristics of the resistive memories enable the resistive memories to act as memory while maintaining significantly low power requirements compared to conventional microprocessors. The resistive memories are also of nano-scale sizes that enable a significant amount of resistive memories to be configured within the analog neuromorphic processing device 100 while still maintaining significantly low power level requirements. The variable resistance capabilities of the resistive memories coupled with the nano-scale size of the resistive memories enable the resistive memories to be configured so that the analog neuromorphic processing device 100 has significant computational efficiency while maintaining the size of the analog neuromorphic processing device 100 to a chip that may easily be positioned on a circuit board.

For example, the resistive memories may include but are not limited to memristors that are nano-scale variable resistance devices with a significantly large variable resistance range. The physics of the resistive memories, such as memristors, require significantly low power and occupy little space so that the resistive memories may be configured in the analog neuromorphic processing device 100 to generate significant computational efficiency from a small chip.

The plurality of input voltages 140($a$-$n$), where n is an integer greater than or equal to one, may be applied to corresponding inputs of the analog neuromorphic processing device 100 to exercise the variable resistance characteristics of the resistive memories. The input voltages 140($a$-$n$) may be applied at a voltage level and for a time period that is sufficient to exercise the variable resistance characteristics of the resistive memories. The input voltages 140($a$-$n$) may vary and/or be substantially similar depending on the types of variable resistance characteristics that are to be exercised by each of the resistive memories.

The resistive memories may be arranged in the analog neuromorphic processing device 100 such that the resistive memories may simultaneously execute multiple addition and multiplication operations in parallel in response to the input voltages 140($a$-$n$) being applied to the inputs of the analog neuromorphic processing device 100. The variable resistance characteristics of the resistive memories as well as their nano-scale size enables a significant amount resistive memories to be arranged so that the input voltages 140($a$-$n$) trigger responses in the resistive memories that are then propagated throughout the analog neuromorphic processing device 100 that results in simultaneous multiplication and addition operations that are executed in parallel.

The simultaneous multiplication and addition operations executed in parallel exponentially increases the efficiency of analog neuromorphic processing device 100 while limiting the power required to obtain such computation capabilities to the input voltages 140(*a-n*). The resistive memories are passive devices so that the simultaneous multiplication and addition operations executed in parallel are performed in the analog domain, which also exponentially decreases the required power. For example, the analog neuromorphic processing device 100 may have significantly more computational efficiency than traditional microprocessor devices, and may be smaller than traditional microprocessor chips while reducing power in a range from 1,000 times to 1,000,000 times that of traditional microprocessors.

The resistive memories may also be arranged such that the simultaneous execution of the multiplication and addition operations in parallel may be configured as a single computation hub that constitutes a single neuron in a neural network. The variable resistance characteristics and the nano-scale size of the resistive memories further enable the arrangement of resistive memories to be scaled with other arrangements of resistive memories so that the single neuron may be scaled into a neural network including multiple neurons. The scaling of a single neuron into multiple neurons exponentially further increases the computational efficiency of the resulting neural network. In addition, the multiple neurons may be scaled into several layers of neurons that further exponentially increases the computational efficiency of the neural network. The scaling of the resistive memories into additional neurons may be done within the analog neuromorphic processing device 100 such as within a single chip. However, the analog neuromorphic processing device 100 may also be scaled with other analog neuromorphic circuits contained in other chips to exponentially increase the computational efficiency of the resulting neural network.

As a result, the analog neuromorphic processing device 100 may be configured into a neural network that has the capability of executing applications with significant computational efficiency, such as image recognition. For example, the output signals 180(*a-n*), where n is an integer greater than or equal to one, may generate signals that correctly identify an image. The analog neuromorphic processing device 100 may also have the learning capability as will be discussed in further detail below so that analog neuromorphic circuits may successfully execute learning algorithms.

The analog neuromorphic processing device 100 implemented as a single neuron and/or multiple neurons in a neural network and/or configured with other similar analog neuromorphic processing device 100 may have significant advantages in traditional computing platforms that require significant computational efficiency with limited power resources and space resources. For example, such traditional computing platforms may include but are not limited to Fast Fourier Transform (FFT) applications, Joint Photographic Experts Group (JPEG) image applications, and/or root mean square (RMS) applications. The implementation of low power neural networks that have a limited physical footprint may also enable this type of computational efficiency to be utilized in many systems that have traditionally not been able to experience such computational efficiency due to the high power consumption and large physical footprint of conventional computing systems. Such systems may include but are not limited to military and civilian applications in security (image recognition), robotics (navigation and environment recognition), and/or medical applications (artificial limbs and portable electronics).

The layering of the analog neuromorphic processing device 100 with other similar analog neuromorphic circuits may enable complex computations to be executed. The compactness of the resistive memory configurations enables fabrication of chips with a high synaptic density in that each chip may have an increased amount of neurons that are fitted onto the chip. The passive characteristics of the resistive memories eliminate the need for software code which increases the security of the analog neuromorphic processing device 100.

Figure 2:
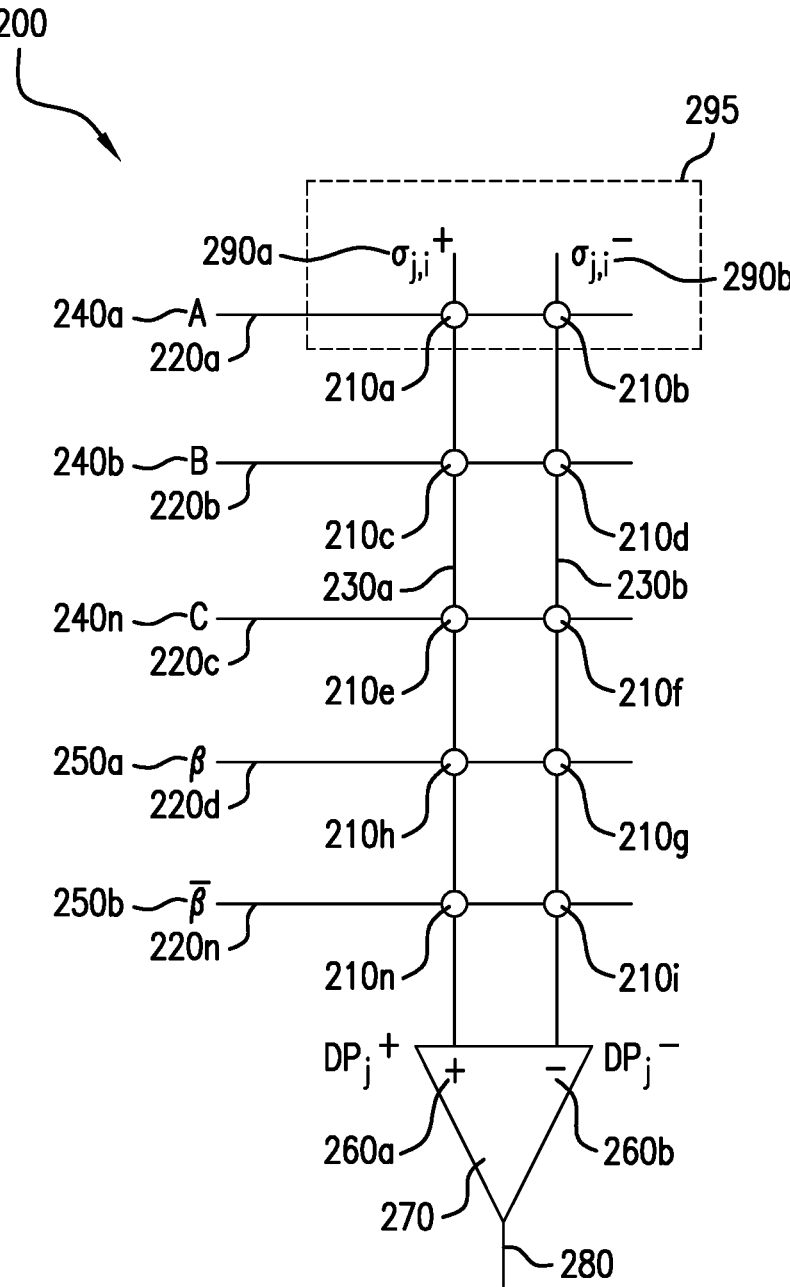
FIG. 2 is a schematic illustration of an exemplary analog neuromorphic circuit that simultaneously executes several computing operations in parallel in accordance with an embodiment of the disclosure.

Referring to FIG. 2, an analog neuromorphic circuit 200 simultaneously executes several computing operations in parallel. The analog neuromorphic circuit 200 includes a plurality of resistive memories 210(*a-n*) where n is an integer equal to or greater than four, a plurality of horizontal wires 220(*a-n*) where n is an integer equal to or greater than two, a pair of vertical wires 230(*a-b*), a plurality of input voltages 240(*a-n*) where n is an integer equal to or greater than two, a pair of bias voltage connections 250(*a-b*), a first and second input of a comparator 260(*a-b*), a comparator 270, an output of the comparator 280, a pair of weights 290(*a-b*), and a combined weight 295. The analog neuromorphic circuit 200 shares many similar features with the analog neuromorphic processing device 100; therefore, only the differences between the analog neuromorphic circuit 200 and the analog neuromorphic processing device 100 are to be discussed in further detail.

The analog neuromorphic circuit 200 may be representative of a single neuron of a neural network. The analog neuromorphic circuit 200 has the capability to be scaled to interact with several other analog neuromorphic circuits so that multiple neurons may be implemented in the neural network as well as creating multiple layers of neurons in the neural network. Such a scaling capability to include not only multiple neurons but also multiple layers of neurons significantly magnifies the computational efficiency of the neural network, as will be discussed in further detail below.

The resistive memories 210(*a-n*) may be laid out in a crossbar configuration that includes a high density wire grid. The crossbar configuration enables the resistive memories 210(*a-n*) to be tightly packed together in the wire grid as will be discussed in further detail below. The tightly packed resistive memories 210(*a-n*) provides a high density of resistive memories 210(*a-n*) in a small surface area of a chip such that numerous analog neuromorphic circuits may be positioned in a neural network on a chip while occupying little space. The crossbar configuration also enables the resistive memories 210(*a-n*) to be positioned so that the analog neuromorphic circuit 200 may execute multiple addition and multiplication operations in parallel in the analog domain. The numerous neuromorphic circuits may then be positioned in the neural network so that the multiple addition and multiplication operations that are executed in parallel may be scaled significantly, thus exponentially increasing the computational efficiency. The resistive memories 210(*a-n*) are passive devices so that the multiple addition and multiplication operations executed in parallel are done in the analog domain, which also exponentially decreases the required power.

In an embodiment, the horizontal wires 220(*a-n*) may be positioned to intersect with the vertical wires 230(*a-b*) to form a wire grid. In an embodiment, the horizontal wires 220(*a-n*) may be positioned orthogonal to the vertical wires 230(*a-b*). Each of the resistive memories 210(*a-n*) may be positioned at an intersection of the wire grid. For example resistive memory 210*a* is positioned at the intersection of horizontal wire 220*a* and the vertical wire 230*a*; the resistive memory 210*b* is positioned at the intersection of horizontal wire 220*b* and the vertical wire 230*b* and so on. The positioning of the horizontal wires 220(*a-n*) and the vertical wires 230(*a-b*) to form a wire grid and the positioning of each of the resistive memories 210(*a-n*) at each intersection of the wire grid may form the crossbar configuration.

Input voltages 240(*a-n*) may be applied to each of the respective horizontal wires 220(*a-c*). In FIG. 1, the input voltage 240*a* is represented by "A", the input voltage 240*b* is represented by "B", and the input voltage 240*n* is represented by "C". For example, the input voltage 240*a* may be applied to the horizontal wire 220*a*, the input voltage 240*b* may be applied to the horizontal wire 220*b*, and the input voltage 240*c* may be applied to the horizontal wire 220*c*. As each of the input voltages 240(*a-n*) is applied to each of the respective horizontal wires 220(*a-c*), the resistance of each of the respective resistive memories 210(*a-f*) is multiplied with each of the respective input voltages 240(*a-n*) to generate a current that is then conducted by each of the respective vertical wires 230(*a-b*). The crossbar configuration then enables the multiplication of each of the respective input voltages 240(*a-n*) with the resistance of each of the resistive memories 210(*a-f*) in parallel so that each of the multiplications is executed simultaneously. The execution of multiple multiplication operations in parallel results in significant computational efficiency as compared to traditional microprocessors that execute each multiplication operation in a chronological order in that the current multiplication operation is completed before the subsequent multiplication operation is executed.

For example, the input voltage 240*a* is applied to the horizontal wire 220*a*. The resistance of the resistive memory 210*a* is multiplied with the input voltage 240*a* to generate a current that is then conducted by the vertical wire 130*a* that intersects the horizontal wire 220*a* at the resistive memory 210*a*. The resistance of the resistive memory 210*b* is multiplied with the input voltage 240*a* to generate a current that is then conducted by the vertical wire 230*b* that intersects the horizontal wire 220*a* at the resistive memory 210*b*. The crossbar configuration then enables the input voltage 240*a* to not only be multiplied by the resistance of the resistive memory 210*a* to generate the current conducted by the vertical wire 230*a* but also the multiplication of the input voltage 140*a* by the resistance of the resistive memory 210*b* in parallel to generate current conducted by the vertical wire 230*b*. The multiplication of the input voltages 240*b* to 240*n* happens in a similar fashion simultaneously with the multiplication of the input voltage 240*a*.

As each of the currents relative to each of the horizontal wires 220(*a-c*) are conducted by each of the vertical wires 230(*a-b*), those currents are then added to generate accumulative currents that are conducted by each of the respective vertical wires 230(*a-b*). For example and as noted above, the application of the input voltage 240*a* to the horizontal wire 220*a* is multiplied by the resistance of the resistive memory 210*a* to generate a current that is then conducted by the vertical wire 230*a*. The application of the input voltage 240*b* to the horizontal wire 220*b* is multiplied by the resistance of the resistive memory 210*c* to generate a current that is also conducted by the vertical wire 230*a*. The current generated from the input voltage 240*a* being applied to the horizontal wire 220*a* is then added to the current generated from the input voltage 240*b* being applied to the horizontal wire 220*b*. The addition of the current generated from the input voltage 240*n* being applied to the horizontal wire 220*c* that is multiplied by the resistance of the resistive memory 210*e* is also added to the currents generated by the input voltage 240*a* being applied to the horizontal wire 220*a* and the input voltage 240*b* being applied to the horizontal wire 220*b* to generate an accumulative current.

The adding of currents conducted by the vertical wire 230*b* is also done in a similar manner. The crossbar configuration enables the adding of the currents conducted by the vertical wire 230*a* to be done in parallel with the adding of the currents conducted by the vertical wire 230*b* so that the addition operations are done simultaneously. The crossbar configuration also enables the adding of the currents to be done simultaneously with the multiplication of each of the input voltages 240(*a-n*) with the resistance of each of the respective resistive memories 210(*a-f*). The simultaneous execution of multiple addition operations as well as multiple multiplication operations results in significant computational efficiency as compared to traditional microprocessors that execute each multiplication operation and then each addition operation in a chronological order in that the current multiplication operation is completed before the subsequent addition operation is executed.

As a result, the analog neuromorphic circuits that are configured into a neural network have the capability of executing applications requiring significant computation power, such as image recognition. Resistive memories 210 (*a-f*) may be utilized in analog neuromorphic systems to approximate the concept of synaptic connectivity in which the resistive memories 210(*a-f*) may be used to store the connection strength between a neuron and all incoming connections as discussed in detail in U.S. Nonprovisional application Ser. No. 17/362,272 which is incorporated by reference in its entirety. The analog neuromorphic circuits also have learning capability as will be discussed in further detail below so that the analog neuromorphic circuits may successfully execute learning algorithms.

Figure 3:
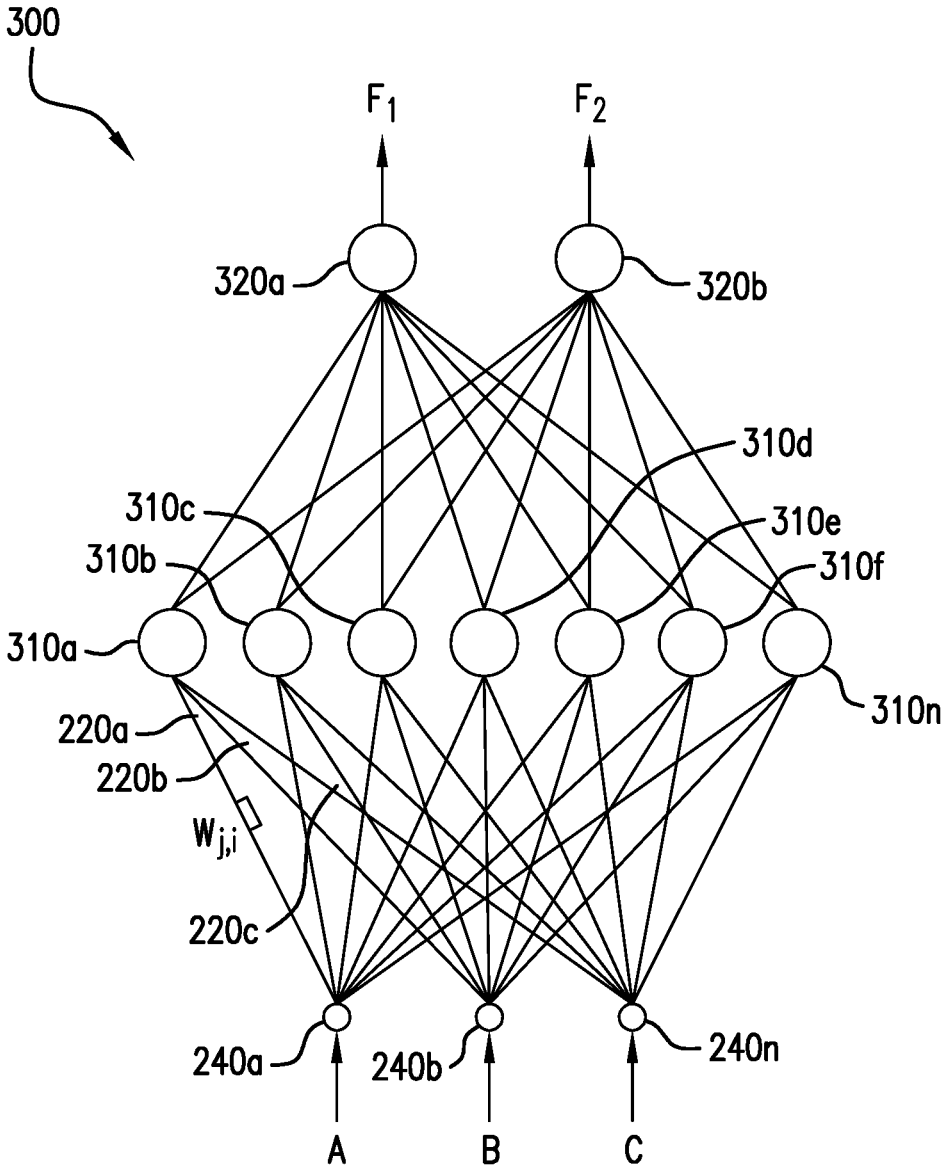
FIG. 3 is a schematic illustration of an exemplary neural network configuration that the analog neuromorphic circuit of FIG. 2 may be implemented and scaled in accordance with an embodiment of the disclosure.

Referring to FIG. 3, in which like reference numerals are used to refer to like parts, neural network configuration 300 that the analog neuromorphic circuit 200 may be implemented and scaled into is shown. The neural network configuration 300 shares many similar features with the analog neuromorphic processing device 100 and the analog neuromorphic circuit 200; therefore, only the differences between the neural network configuration 200 and the analog neuromorphic processing device 100 and the analog neuromorphic circuit 200 are to be discussed in further detail.

The analog neuromorphic circuit 200 may be implemented into the neural network configuration 300. The analog neuromorphic circuit 200 may constitute a single neuron, such as neuron 310*a* in the neural network configuration 300. As shown in FIG. 3, the input voltage 240*a* and represented by "A" is applied to the horizontal wire 220*a*, the input voltage 240*b* and represented by "B" is applied to the horizontal wire 220*b*, and the input voltage 240*n* and represented by "C" is applied to the horizontal wire 220*c*. The combined weight 295 as shown in FIG. 2 as representative of the combined weight for the input voltage 240*a* is shown as $W_{j,\,i}$ in FIG. 3. Similar combined weights for the input voltage 240*b* and the input voltage 240*n* may also be represented in FIG. 3 in a similar fashion. The wire grid, the resistive memories 210(*a-n*), and the comparator 270 are represented by the neuron 310*a*. The output 280 of the analog neuromorphic circuit 200 is coupled to additional neurons 320*a* and 320*b*.

The analog neuromorphic circuit 200 may then be scaled so that similar circuits may be configured with the analog neuromorphic circuit 200 to constitute additional neurons, such as neurons 310(*b-n*) where n is an integer greater than or equal to two. Each of the other neurons 310(*b-n*) includes similar circuit configurations as the analog neuromorphic circuit 200. However, the resistances of the resistive memories associated with each of the other neurons 310(*b-n*) may differ from the analog neuromorphic circuit 200 so that outputs that differ from the output 280 of the analog neuromorphic circuit 200 may be generated.

Rather than limiting the input voltages 240(*a-n*) to be applied to a single neuron 310, the input voltages 240(*a-n*) may also be applied to multiple other neurons 310(*b-n*) so that each of the additional neurons 310(*b-n*) also generate outputs that differ from the output 280 generated by the analog neuromorphic circuit 200. The generation of multiple different outputs from the different neurons 310(*a-n*) exponentially increases the computational efficiency of the neural network configuration 300. As noted above, the analog neuromorphic circuit 200 represented by the neuron 310*a* operates as a single logic function with the type of logic function being adjustable. The addition of neurons 310(*b-n*) provides additional logic functions that also have the capability of their logic functions being adjustable so that the computational efficiency of the neural network configuration 300 is significant.

In addition to having several different neurons 310(*a-n*), the analog neuromorphic circuit 200 may also be scaled to include additional layers of neurons, such as neurons 320 (*a-b*). The scaling of additional layers of neurons also exponentially increases the computational efficiency of the neural network configuration 300 to the extent that the neural network configuration 300 can execute learning algorithms. For example, a neural network configuration with a significant number of input voltages, such as several hundred, that are applied to a significant number of neurons, such as several hundred, that have outputs that are then applied to a significant number of layers of neurons, such as ten to twenty, may be able to execute learning algorithms. The repetitive execution of the learning algorithms by the extensive neural network configuration may result in the neural network configuration eventually attaining automatic image recognition capabilities.

For example, the neural network configuration may eventually output a high voltage value of "$F_1$" representative of the binary signal "1" and output a low voltage value of "$F_2$" representative of the binary signal "0" when the neural network configuration recognizes an image of a dog. The neural network configuration may then output a low voltage value of "$F_1$" representative of the binary signal "0" and output a high voltage value of "$F_2$" representative of the binary signal "1" when the neural network configuration recognizes an image that is not a dog.

Figure 4:
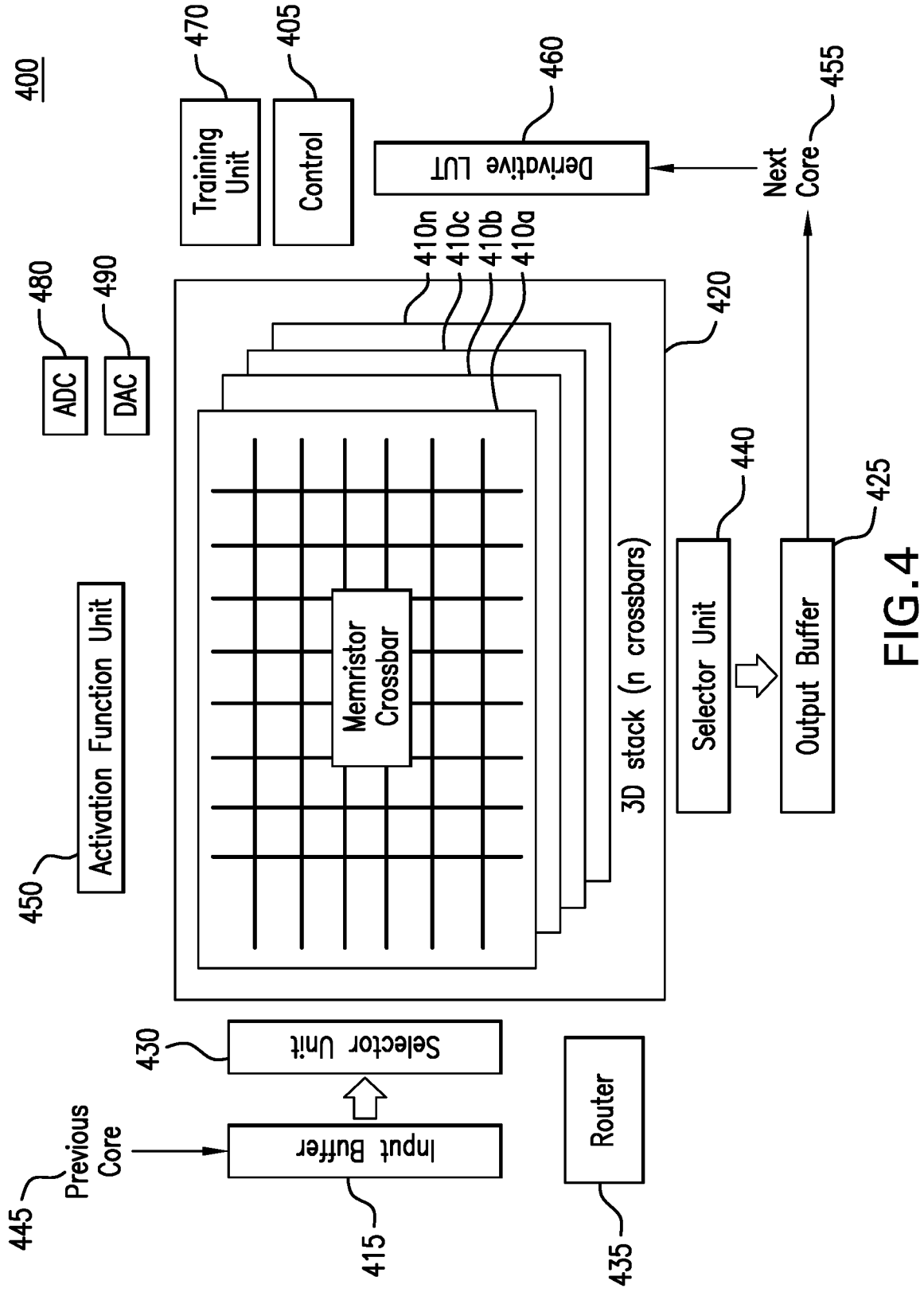
FIG. 4 is a schematic illustration of a detailed neural network detailed analog neuromorphic 3D circuit configuration implementing analog neuromorphic circuits similar to the analog neuromorphic circuit of FIG. 2 in accordance with an embodiment of the disclosure.

Referring to FIG. 4, in which like reference numerals are used to refer to like parts, a detailed analog neuromorphic 3D circuit configuration 400 is shown. The analog neuromorphic 3D circuit configuration 400 shares many similar features with the analog neuromorphic processing device 100, the analog neuromorphic circuit 200, and the neural network configuration 300; therefore, only the differences between the analog neuromorphic 3D circuit configuration 400 and the analog neuromorphic processing device 100, the analog neuromorphic circuit 200 and the neural network configuration 300 are to be discussed in more detail.

The analog neuromorphic 3D circuit configuration 400 includes a plurality of resistive memory crossbar configurations 410(*a-n*), where n is an integer greater than one, with each resistive memory crossbar configuration 410(*a-n*) positioned in the analog neuromorphic circuit configuration 400 in a stack thereby forming a three-dimensional (3D) stack of the plurality of resistive memory crossbar configurations

410(*a-n*). An increase in the quantity of resistive memory crossbar configurations in an analog neuromorphic circuit increases the computation power of the analog neuromorphic circuit with a minimal increase in the amount of power required to power each of the resistive memory crossbar configurations based on the architecture of resistive memories as discussed above. However, the addition of additional resistive memory crossbar configuration in a conventional manner in which simply adding each resistive memory crossbar configuration to the silicon wafer without any type of vertical stacking still increases the surface area of the chip manufactured for the analog neuromorphic circuit. As a result, the positioning of each resistive memory crossbar configuration 410(*a-n*) in which each resistive memory crossbar configuration 410(*a-n*) may be vertically stacked on top of each other resistive memory crossbar configuration 410(*a-n*) thereby forming a 3D stack 420 of the resistive memory crossbar configurations 410(*a-n*) enables a significant increase in computation power to the analog neuromorphic 3D circuit configuration 400.

Each resistive memory crossbar configuration 410(*a-n*) may include identical physical dimensions and characteristics in which each resistive memory crossbar configuration 410(*a-n*) may have the same size, surface area, inputs, outputs, weight, horizontal wires for each resistive memory crossbar configuration 410(*a-n*) aligned, vertical wires for each resistive memory crossbar configuration 410(*a-n*) aligned, resistive memories for each resistive memory crossbar configuration 410(*a-n*) aligned and so on. In doing so, each resistive memory crossbar configuration 410(*a-n*) may be vertically stacked on top of each other resistive memory crossbar configuration 410(*a-n*) in which each of the components of each resistive memory crossbar configuration 410(*a-n*) are aligned thereby creating a 3D stack 420 that maintains the width, length, thickness, and over all surface area of a single resistive memory crossbar configuration. As a result, only the depth of the 3D stack 420 is increased by the addition of each resistive memory crossbar configuration 410(*a-n*) while increasing the computation power of the analog neuromorphic 3D circuit configuration 400 without occupying additional surface area of the silicon wafer for the chip manufactured to house the analog neuromorphic 3D circuit configuration 400.

The decrease in surface area of silicon wafer required by the chip that houses the analog neuromorphic 3D circuit configuration 400 significantly decreases the overall cost to manufacture the chip that houses the analog neuromorphic 3D circuit configuration 400. Typically, up to 60% of the cost of the chip is attributed to the overall size of the chip. Conventionally, a silicon wafer includes a quantity of defects located on different sites of the silicon wafer. As the size of the chip is increased, the likelihood in which the chip may include a defect on the silicon wafer and have to be discarded also increases thereby increasing the cost of the chip. For example, a chip is 5.0 cm$^2$ and twenty chips are to be manufactured from a silicon wafer that includes defects located at ten different sites of the silicon wafer. Based on the ten sites with defects located on the silicon wafer, ten chips of the twenty chips manufactured from the silicon wafer have to be discarded due to the 5.0 cm$^2$ size of each chip due to ten chips manufactured from the ten sites of the silicon wafer with defects. However, the decrease in size of the chip from 5.0 cm$^2$ to 1.0 cm$^2$ increases the quantity of chips manufactured from the silicon wafer with ten sites of defects from twenty chips to 100 chips. Ten chips manufactured from the silicon wafer still need to be discarded as those ten chips include defects from the ten sites of the silicon wafer that include defects. Rather than ten total chips generated for the 5.0 cm² sized chip that are generated and not defective, ninety total chips generated for the 1.0 cm² sized chip are generated and not defective from the same silicon wafer with defects at ten different sites.

As a result, the positioning each of the resistive memory crossbar configurations 410(*a-n*) into a 3D stack 420 significantly decreases the cost of the chip that includes the analog neuromorphic 3D circuit configuration 400 while increasing the computation power of the analog neuromorphic 3D circuit configuration 400. The positioning of each resistive memory crossbar configuration 410(*a-n*) into a 3D stack 420 increases the computation power of the analog neuromorphic 3D circuit configuration 400 without increasing the overall surface area of the silicon wafer occupied by the resistive memory crossbar configurations 410(*a-n*). The surface area of the silicon wafer occupied by the resistive memory crossbar configurations 410(*a-n*) is maintained to the surface area of a single resistive memory crossbar configuration 410(*a-n*) due to the positioning of each resistive memory crossbar configuration 410(*a-n*) into the 3D stack 420. In doing so, the cost of the chip of the resistive memory crossbar configuration 410(*a-n*) decreases despite the addition of computation power as each resistive memory crossbar configuration 410(*a-n*) is positioned on top of each in the 3D stack 420 without increasing the size of the silicon wafer required to accommodate each additional resistive memory crossbar configuration 410(*a-n*).

Conventionally, the positioning of circuits with active components into a 3D stacking architecture is not feasible due to the heat dissipation. Conventionally, circuits with active components dissipate heat when operating and when positioned in a 3D stack, the heat dissipated by each circuit with active components rises up through the 3D stack. Typically, each of the circuits with active components positioned in a conventional 3D stack are operating simultaneously resulting in each circuit with active components dissipating heat simultaneously. As each circuit with active components dissipates heat simultaneously, the heat dissipated by each circuit with active components rises and combines with the heat dissipated by each circuit with active components positioned above thereby compounding the heat dissipation. Such heat dissipation generated by the conventional 3D stack of circuits with active components is so significant that actions taken to remove the heat dissipation either fails and the conventional chips that include such conventional 3D stacks of circuits with active components are eventually damaged from the heat dissipation and/or such actions to adequate remove the heat dissipation are significantly expensive thereby overriding the cost savings in a decrease in surface area of the silicon wafer in which the conventional 3D stack of circuits with active components is positioned. As a result, the conventional positioning of circuits with active components into a 3D stacking architecture is not typically done.

However, as noted above, the architecture of resistive memories enables resistive memories to operate as passive components the majority of the time thereby significantly decreasing the power consumed by analog neuromorphic circuits that include resistive memories to the μW to mW range. Such low levels of power consumed by analog neuromorphic circuits that include resistive memories results in significantly low dissipation of heat by analog neuromorphic circuits that include resistive memories and particularly in comparison to conventional circuits with active components. As a result, each resistive memory crossbar configuration 410(*a-n*) individually consumes decreased levels of power and thereby have significantly decreased heat dissipation based on the power consumption being in the μW to mW range.

Then, the positioning of each resistive memory crossbar configuration 410(*a-n*) into the 3D stack 420 further does not result in a significant increase in heat dissipation that results in eventual damage to the chip or a significant increase in cost to remove the dissipated heat of the resistive memory crossbar configurations 410(*a-n*) due to the power consumption of each resistive memory crossbar configuration 410(*a-n*). Even with each resistive memory crossbar configuration 410(*a-n*) being active simultaneously, the collective heat dissipation of each of the resistive memory crossbar configurations 410(*a-n*) operating simultaneously in the 3D stack 420 in the μW to mW range does not cause damage to the chip over time and/or require expensive actions to remove the heat dissipation. Further, a single resistive memory crossbar configuration 410(*a-n*) may be active while the remaining resistive memory crossbar configurations 410(*a-n*) remain inactive while the single resistive memory crossbar configuration 410(*a-n*) remains active. In doing so, the power consumption of each resistive memory crossbar configuration 410(*a-n*) positioned in the 3D stack 420 may be further limited to simply the significantly low power consumption a single resistive memory crossbar configuration 410(*a-n*) being in the μW to mW range.

As a result, the positioning each of the resistive memory crossbar configurations 410(*a-n*) into the 3D stack 420 continues to limit the amount of heat dissipation generated by the 3D stack while increasing the computation power of the analog neuromorphic 3D circuit configuration 400 without causing damage over time to the chip that houses the analog neuromorphic 3D circuit configuration 400 and/or requiring expensive actions to remove the heat dissipation. The positioning of each resistive memory crossbar configuration 410(*a-n*) into the 3D stack 420 prevents an increase in heat dissipation that is typically seen in conventional 3D stacks of circuits with active components while enabling an increase in the computation power of the analog neuromorphic 3D circuit configuration 400 without increasing the overall surface area of the silicon wafer beyond the surface area of a single resistive memory crossbar configuration 410(*a-n*). In doing so, the cost of the chip of the resistive memory crossbar configuration 410(*a-n*) decreases without a significant increase in heat dissipation despite the addition of computation power due to each resistive memory crossbar configuration 410(*a-n*) being positioned into the 3D stack 420.

The positioning of the resistive memory crossbar configurations 410(*a-n*) into the 3D stack 420 may enable the elimination of redundant peripheral circuitry included in the analog neuromorphic 3D circuit configuration 400. The peripheral circuitry includes components that assists the resistive memory crossbar configurations 410(*a-n*) with regard to the processing of the input voltages applied to the resistive memory crossbar configurations 410(*a-n*) as well as the output voltages generated by the resistive memory crossbar configurations 410(*a-n*) in order for the resistive memory crossbar configurations 410(*a-n*) to execute the neurological processing capabilities discussed in detail above. The peripheral circuitry may include but is not limited to an input buffer 415, an input selector 430, a router 435, an output selector unit 440, an output buffer 425, a derivative calculating block 460, a control unit 405, a training unit 470, a digital to analog converter (DAC) 490, an analog to digital converter (ADC) 480, an activation function unit 450, and/or any other type of component that is not included in the resistive memory crossbar configurations 410(*a-n*) and/or the 3D stack 420 that assists in the processing of the resistive memory crossbar configurations 410(*a-n*) that will be apparent to those skilled in the art relevant art(s) without departing from the spirit and scope of the disclosure.

Rather than each resistive memory crossbar configuration 410(*a-n*) requiring its own set of peripheral circuitry in which n sets of peripheral circuitry would be required for each resistive memory crossbar configuration 410(*a-n*), the positioning of each resistive memory crossbar configuration 410(*a-n*) into the 3D stack 420 eliminates the need for n sets of peripheral circuitry and only a single set of peripheral circuitry required by a single resistive memory crossbar configuration 410(*a-n*) is required. In doing so, each resistive memory crossbar configuration 410(*a-n*) positioned in the 3D stack 420 may share the single set of peripheral circuitry thereby eliminating the need of n sets of peripheral circuitry that would be redundant. A plurality of peripheral circuitry may assist the plurality of resistive memory crossbar configurations 410(*a-n*) positioned in the 3D stack 420 in the execution of the function based on the plurality of input voltages applied to each selected resistive memory crossbar configuration 410(*a-n*). The plurality of peripheral circuitry is shared by each resistive memory crossbar configuration 410(*a-n*) positioned in the 3D stack 420 thereby eliminating peripheral circuitry that is redundant and implemented by each resistive memory crossbar configuration 410(*a-n*) rather than shared by each resistive memory crossbar configuration 410(*a-n*).

As noted above, each resistive memory crossbar configuration 410(*a-n*) may include identical physical dimensions and characteristics in which each resistive memory crossbar configuration 410(*a-n*) may have the same size, surface area, inputs, outputs, weight, horizontal wires for each resistive memory crossbar configuration 410(*a-n*) aligned, vertical wires for each resistive memory crossbar configuration 410(*a-n*) aligned, resistive memories for each resistive memory crossbar configuration 410(*a-n*) aligned and so on. As a result, each resistive memory crossbar configuration 410(*a-n*) may be identical in which only the weights associated with each resistive memory included in each resistive memory crossbar configuration 410(*a-n*) differing. In doing so, each resistive memory crossbar configuration 410(*a-n*) requires identical peripheral circuitry. Thus, a single set of peripheral circuitry may be shared by the resistive memory crossbar configurations 410(*a-n*) positioned in the 3D stack 420 and eliminating the need for n sets of peripheral circuitry thereby further decreasing the size and the cost of the chip that includes the analog neuromorphic 3D circuit configuration 400.

A plurality of input voltages may be applied to an input selector unit 430 and the input selector unit 430 may select a first selected resistive memory crossbar configuration 410(*a-n*) that the plurality of input voltages is to be applied. Each input voltage corresponds to a corresponding input of the first selected resistive memory crossbar configuration positioned in the 3D stack 420 as first selected by the input selector 530. As noted above, each resistive memory crossbar configuration 410(*a-n*) may include an identical quantity of inputs. Rather than having input voltages applied to each resistive memory crossbar configuration 410(*a-n*) thereby requiring n sets of peripheral circuitry for each resistive memory crossbar configuration 410(*a-n*), a single set of input voltages may be applied to the 3D stack 420. The input selector unit 430 may then select the resistive memory crossbar configuration 410(*a-n*) that the input voltages are to be applied based on instruction from the control unit 405. For example, the input selector unit 430 may first select resistive memory crossbar configuration 410*a* as the first resistive memory crossbar configuration that the input voltages are to be applied as instructed by the control unit 405. The input selector unit 430 may then select resistive memory crossbar configuration 410*n* as the second resistive memory crossbar configuration that the input voltages are to be applied as instructed by the control unit 405 and so on.

A plurality of output voltages may be generated by the first selected resistive memory crossbar configuration 410 (*a-n*) from a propagation of in the input voltages through a plurality of resistive memories positioned on the first selected resistive memory crossbar configuration 410(*a-n*). An output selector unit 440 may select the first selected resistive memory crossbar configuration 510(*a-n*) that the plurality of output voltages is generated from. Each output voltage corresponds to a corresponding output of the first selected resistive memory crossbar configuration 410(*a-n*) positioned in the 3D stack 420 as selected by the output selector unit 440. As noted above, each resistive memory crossbar configuration 410(*a-n*) may include an identical quantity of outputs. Rather than having output voltages generated by each resistive memory crossbar configuration 410(*a-n*) simultaneously thereby requiring n sets of peripheral circuitry for each resistive memory crossbar configuration 410(*a-n*), a single set out output voltages may be generated by the 3D stack 420 at a time. The output selector unit 440 may then select the resistive memory crossbar configuration 410(*a-n*) that is generating the output voltages based on the instruction from the control unit 405. For example, the output selector unit 440 may first select resistive memory crossbar configuration 410*a* as the first resistive memory crossbar configuration that is generating output voltages as instructed by the control unit 405. The output selector unit 440 may then select the resistive memory crossbar configuration 410*n* as the second resistive memory crossbar configuration that is generating the output voltages as instructed by the control unit 405 and so on.

Figure 5:
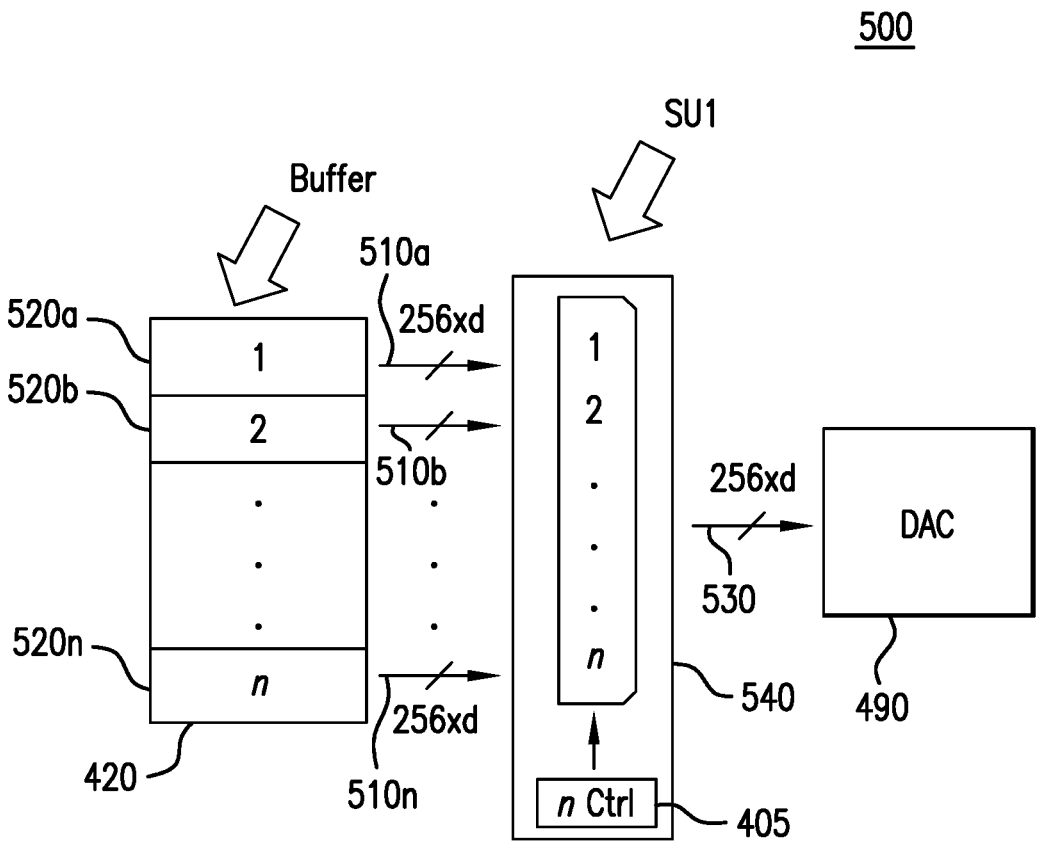
FIG. 5 is a schematic illustration of a detailed first input selector configuration that may be implemented in the analog neuromorphic 3D circuit configuration of FIG. 4 in accordance with an embodiment of the disclosure.

An activation function unit 450 may receive the plurality of output voltages generated from the first selected memory crossbar configuration 410(*a-n*) and execute a function based on the plurality of output voltages received from the first selected memory crossbar configuration 410(*a-n*). The activation function unit 450 may execute a function such as a non-linear transform such as a sigmoid function, arctan function, and so on based on the output voltages received from the selected memory crossbar configuration 410(*a-n*) based on the required function of the analog neuromorphic 3D circuit configuration 500. For example, the activation function unit 450 may execute a non-linear transform to perform a recognition function, a training function, a supervised learning function, an unsupervised learning function, and/or any other type of function that may be executed by a neuromorphic processing system that will be apparent to those skilled in the art relevant art(s) without departing from the spirit and scope of the disclosure Referring to FIG. 5, in which like reference numerals are used to refer to like parts, a detailed a first input selector configuration 500 is shown. The first input selector configuration 500 shares many similar features with the analog neuromorphic processing device 100, the analog neuromorphic circuit 200, the neural network configuration 300, and the analog neuromorphic 3D circuit configuration 400; therefore, only the differences between the first input selector configuration 500 and the analog neuromorphic processing device 100, the analog neuromorphic circuit 200, the neural network configuration 300, and the analog neuromorphic 3D circuit configuration 400 are to be discussed in more detail.

In an embodiment, the analog neuromorphic 3D circuit configuration 400 may include the input buffer 415 and a first input selector unit 540 unit. The analog neuromorphic 3D circuit configuration 400 may include the input selector unit 430 discussed in FIG. 4 in which the input selector unit 430 may be a multiplexor and/or any other type of component that may select the resistive memory crossbar configuration 410(*a-n*) in which the input voltages are to be applied that will be apparent to those skilled in the art relevant art(s) without departing from the spirit and scope of the disclosure. However, the analog neuromorphic 3D circuit configuration 400 may also include more than one input selector unit that will be apparent to those skilled in the art relevant art(s) without departing from the spirit and scope of the disclosure. The analog neuromorphic 3D circuit configuration 400 may also include the output selector unit 440 discussed in FIG. 4 in which the output selector unit 440 may be a demultiplexor and/or any other type of component that may select the resistive memory crossbar configuration 410(*a-n*) in which the output voltages are to be received that will be apparent to those skilled in the art relevant art(s) without departing from the spirit and scope of the disclosure. The analog neuromorphic 3D circuit configuration 400 may also include the weight update selector unit 830 and the back propagation selector unit 840 discussed in FIG. 8 in which the weight update selector unit 830 may be a multiplexor and the back propagation selector unit 840 may be a demultiplexor but the weight update selector unit 830 and the back propagation selector unit 840 may be any other type of component that may be select the resistive memory crossbar configuration 410(*a-n*) that will be apparent to those skilled in the art relevant art(s) without departing from the spirit and scope of the disclosure. The input selector unit 430, output selector unit 440, weight update selector unit 830, and the back propagation selector unit 840 may be same component and/or independent components. The quantity of input selector units 430, output selector units 440, weight update selector unit 830, and the back propagation selector unit 840 may be independent components and/or any combination thereof that will be apparent to those skilled in the art relevant art(s) without departing from the spirit and scope of the disclosure.

With regard to the embodiment disclosed in the first input selector configuration 500, a digital signal is initially presented as input to the analog neuromorphic 3D circuit configuration 400 as a request to be executed as a function by the analog neuromorphic 3D circuit configuration 400. For example, the digital signal that is initially presented as a request to be executed as a function by the analog neuromorphic 3D circuit configuration 400 may be an image that the analog neuromorphic 3D circuit configuration is requested to recognize. As a result, the digital signal may be presented as input to the analog neuromorphic 3D circuit configuration in an n-bit signal where n is an integer equal to or greater than one, such as an 8-bit signal. The input buffer 415 includes levels 520(*a-n*) of digital storage where n is an integer that equals the quantity of resistive memory crossbar configurations 410(*a-n*) included in the 3D stack 420. Each level of the input buffer 415 is storing a quantity of values that equals the quantity of inputs associated with each of the resistive memory crossbar configurations 410(*a-n*) times the quantity of bits included in the digital signal as seen in the FIG. 5 with regard to the output buffer signals 510(*a-n*) where n is an integer equal to the quantity of levels 520(*a-n*).

For example, the 3D stack 420 includes ten resistive memory crossbar configurations 410(*a-n*). As a result, the input buffer includes ten levels 520(*a-n*) of digital storage to correspond to the ten resistive memory crossbar configurations 410(*a-n*). Each resistive memory crossbar configuration 410(*a-n*) then includes 256 inputs. As a result, each of the ten levels 520(*a-n*) of the input buffer 415 stores 256 values times 8 bits to correspond to the 256 inputs for each resistive memory crossbar configuration 410(*a-n*) and the 8-bits included in the digital signal as represented by each output buffer signal 510(*a-n*) which includes 256×D which equates to 256 inputs for each resistive memory crossbar configuration 410(*a-n*) and D which equates to 8 bits included in the digital signal for this example.

The control unit 405 may then instruct the first selector unit 540 as to which level 520(*a-n*) of the input buffer 415 that is to be selected to present the values stored in the selected level 520(*a-n*) which equals the quantity of inputs for each of the resistive memory crossbar configurations 410(*a-n*) times the quantity of bits included in the digital signal. The level 520(*a-n*) that the control unit 405 instructs the first selector unit 540 to select corresponds to the resistive memory crossbar configuration 410(*a-n*) that is selected by control unit 405 to have the values stored in the selected level 520(*a-n*) applied to the selected resistive memory crossbar configuration 410(*a-n*). The first selector unit then provides the values stored in the selected level 520(*a-n*) as the first selector output signal 530 to the DAC 490. For example, the control unit 405 may instruct the first selector unit 540 to select level 520*c* to present the values stored in the level 520*c* which equals the quantity 256 for the quantity of 256 inputs for each of the resistive memory crossbar configurations 410(*a-n*) times the quantity of 8 for the 8-bits included in the digital signal. As a result, the first input selector unit 540 selects level 520*c* in which the values stored in the level 520*c* are to be applied to the selected resistive memory crossbar configuration 410*c* and provides the values stored in the level 520*c* which equals the quantity 256 for the quantity of 256 inputs for the selected resistive memory crossbar configuration 410*c* times the quantity of 8 for the 8-bits included in the digital signal to the DAC 490 as the first selector output signal 530.

Figure 6:
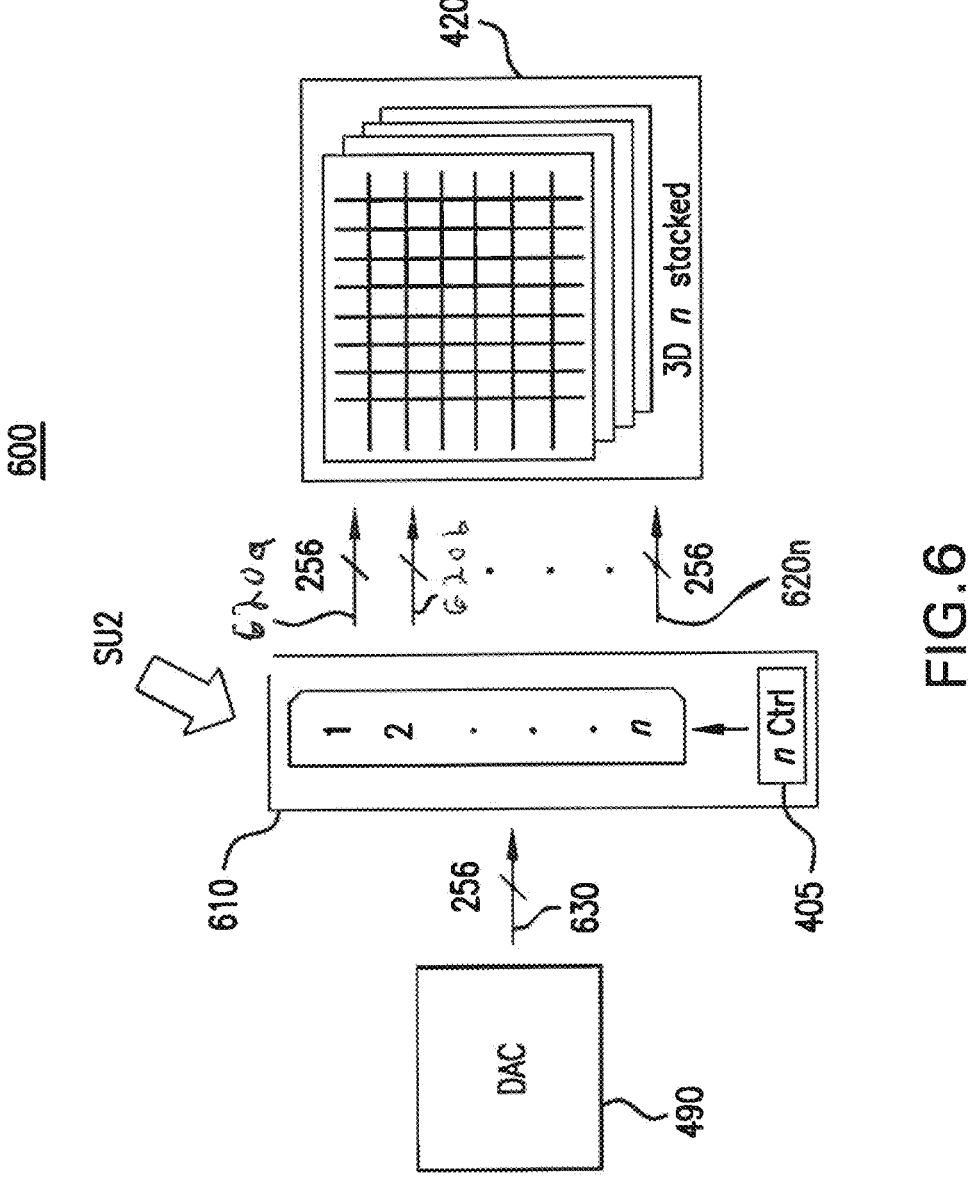
FIG. 6 is a schematic illustration of a detailed second input selector that may be implemented in the analog neuromorphic 3D circuit configuration of FIG. 4 in accordance with an embodiment of the disclosure.

Referring to FIG. 6, in which like reference numerals are used to refer to like parts, a detailed second input selector configuration 600 is shown. The second input selector configuration 600 shares many similar features with the analog neuromorphic processing device 100, the analog neuromorphic circuit 200, the neural network configuration 300, the analog neuromorphic 3D circuit configuration 400, and the first input selector configuration 500; therefore, only the differences between the second input selector configuration 600 and the analog neuromorphic processing device 100, the analog neuromorphic circuit 200, the neural network configuration 300, the analog neuromorphic 3D circuit configuration 400, and the first input selector configuration 500 are to be discussed in more detail.

In an embodiment, the analog neuromorphic 3D circuit configuration 400 may include the DAC 490, a second input selector unit 610, and the 3D stack 420. As noted above, the DAC 490 receives the first selector output signal 530 from the first input selector unit 540 which includes the values stored in the selected level 520(*a-n*) which is the quantity of inputs for each of the resistive memory crossbar configurations 410(*a-n*) and the quantity of n-bits included in the digital signal wide. The DAC 490 then converts each digital bit value included in the first selector output signal 530 for each input and each bit to a single input voltage value. The DAC 490 then generates an input voltage value for each of the inputs of the selected resistive memory crossbar configurations 410(*a-n*). The DAC 490 then provides each of the input voltage values as an input voltage value signal 630 to the second input selector unit 610. The second input selector unit 610 then selects the resistive memory crossbar configuration 410(*a-n*) that the input voltages converted by the DAC 490 are to be applied based on the instruction provided by the control unit 405. The input voltages 620(*a-n*) may then be applied to each corresponding input of the selected resistive memory crossbar configuration 410(*a-n*) positioned in the 3D stack 420.

Following the example above, the DAC 490 receives the first selector output signal 530 from the first input selector unit 540 which includes the values in the selected level of 520c which is the quantity of inputs of 256 for each of the resistive memory crossbar configurations 410(*a-n*) and the quantity of 8 bits included in the digital signal wide. The DAC 490 then converts each digital bit value included in the first selector output signal 530 for each of the 256 inputs and each of the 8 bits to a single output voltage value. The DAC 490 then generates an input voltage value for each of the 256 inputs of the selected resistive memory crossbar configuration 410c. The DAC 490 then provides each of the input voltage values as an input voltage value signal 630 to the second input selector unit 610. The second input selector unit 610 then selects the resistive memory crossbar configuration 410c that the input voltages converted by the DAC 490 are to be applied based on the instruction provided by the control unit 405. The input voltages 620(*a-n*) may then be applied to each corresponding input of the selected resistive memory crossbar configuration 410c positioned on the 3D stack 420.

Returning to FIG. 4, as noted above the selected resistive memory crossbar configuration 410(*a-n*) may generate output voltages as each input voltage applied to the selected resistive memory crossbar configuration 410(*a-n*) propagates through each of the resistive memories included in the selected resistive memory crossbar configuration 410(*a-n*) thereby generating output voltages at each column of the selected resistive memory crossbar configuration 410(*a-n*). The output selector unit 440 may then select the selected resistive memory crossbar configuration 410(*a-n*) in which the output voltages generated by the selected resistive memory crossbar configuration 410(*a-n*) are to be provided to the output buffer 425 as instructed by the control unit 405. The output selector unit 440 may include an Op-Amp circuit in which each of columns of the selected resistive memory crossbar configuration 410(*a-n*) may provide the output voltages to the Op-Amp circuit. Each of the voltage values provided by the Op-Amp circuit are voltage values represented by a curve such as a sigmoid function. The voltage values as represented by the curve may be provided to the ADC 480 from the Op-Amp circuit. The ADC 480 may then compress the voltage values represented by the curve based on the slope of the curve into digital values of "0" or "1". The output voltages values converted into corresponding digital values may be provided to the output buffer 425 and the activation function unit 450 may then access the digital values corresponding to the output voltages of the selected resistive memory crossbar configuration 410(*a-n*). The activation unit 450 may then execute the function as requested based on the output voltages of the selected resistive memory crossbar configuration 410(*a-n*) and converted to digital values.

Figure 7:
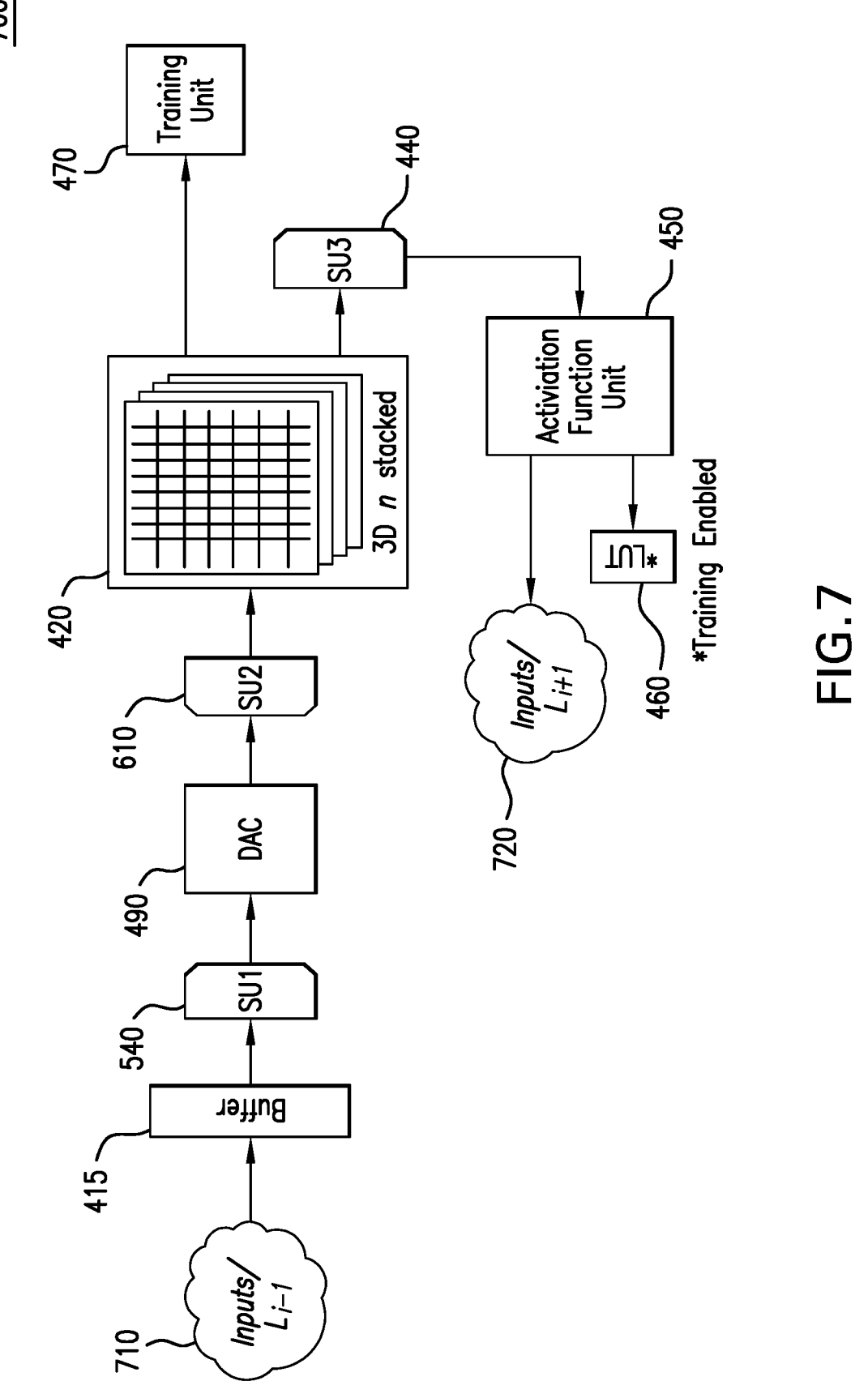
FIG. 7 is a schematic illustration of a detailed recognition architecture configuration that may be implemented in the analog neuromorphic circuit configuration of FIG. 4 in accordance with an embodiment of the disclosure.

Referring to FIG. 7, in which like reference numerals are used to refer to like parts, a detailed recognition architecture configuration 700 is shown. The recognition architecture configuration 700 shares many similar features with the analog neuromorphic processing device 100, the analog neuromorphic circuit 200, the neural network configuration 300, the analog neuromorphic 3D circuit configuration 400, the first input selector configuration 500, and the second input selector configuration 600; therefore, only the differences between the recognition architecture configuration 700 and the analog neuromorphic processing device 100, the analog neuromorphic circuit 200, the neural network configuration 300, the analog neuromorphic 3D circuit configuration 400, the first input selector configuration 500, and the second input selector configuration 600 are to be discussed in more detail.

The analog neuromorphic 3D circuit configuration 400 that includes the 3D stack 420 may be incorporated into the recognition architecture 700 in which the recognition architecture is presented with input data 710 which represents a request to be executed and such input data is then propagated through the recognition architecture 700 including the selected resistive memory crossbar configurations 410(*a-n*) in which the output of such propagation may represent a potential outcome to the request. In doing, so activation function unit 450 executes a recognition function that generates a plurality of potential outcomes based on the output voltages generated by the first selected resistive memory crossbar configuration 410(*a-n*). Each of the plurality of outcomes is a potential outcome to a request that includes input data that is applied to the first selected resistive memory crossbar configuration 410(*a-n*) as input data.

For example, the recognition architecture 700 may be presented with a request to recognize an image. In doing so input data 710 is presented to the input buffer 415 as discussed in detail above with regard to a digital signal that includes n-bits and represents the image that is requested to be recognized. The input data 710 is then converted into input voltage values by the DAC 490. The input selector units 540 and 610 assist in selecting the resistive memory crossbar configuration 410(*a-n*) in which the input voltages are to be applied as converted from the input data 710. The input voltages then propagate through the selected resistive memory crossbar configurations 410(*a-n*) included in the 3D stack 420 and the output selector unit 440 selects the resistive memory crossbar configuration 410(*a-n*) in which the output voltages that are output in a function such as a sigmoid function are provided to the ADC 480 in which the ADC 480 then compresses to a digital values. The activation function unit 450 then attempts to recognize the image based on the digital values converted from the output voltages of the selected resistive memory crossbar configuration 410(*a-n*) and generates output data 720 that represents the potential outcome in recognizing the image.

In addition to executing the recognition function, the recognition architecture 700 may also execute a training function when the training unit 470 and derivative calculating block 460 are implemented. The training unit 470 may propagate back into the first selected resistive memory crossbar configuration 410(*a-n*) a plurality of adjusted resistance values 410(*a-n*) for each corresponding resistive memory positioned in the first selected resistive memory crossbar configuration 410(*a-n*) based on a comparison of the output voltages generated by the first selected resistive memory crossbar configuration to a plurality of threshold output voltages to train the first selected resistive memory crossbar configuration 410(a-n). The threshold of output voltages may identify a correct outcome to the request.

Rather than simply acting on the output data 720 generated by the activation function unit 450 in which the output data 720 provides a potential outcome to the request applied to the analog neuromorphic 3D circuit configuration 400 when executing the recognition function, the recognition architecture 700 may then determine the deviation in the output data 720 from the what the output data 720 should be in order to provide the proper potential outcome to the request. In doing so, the training unit 470 and the derivative calculating block 460 may be implemented in order to determine the deviation in the output data 720 which corresponds to the output voltages generated by the selected resistive memory crossbar configuration 410(a-n) and the threshold of output voltages that identify the correct outcome to the request. In doing so, the training unit 470 and the derivative calculating block 460 may update the weights of the resistive memories positioned in the selected resistive memory crossbar configuration 410(a-n) to train the selected resistive memory crossbar configuration 410(a-n) to eventually generate the correct potential outcome to the request over numerous iterations of training.

For example, the request may be to correctly identify an image. After the output voltages are generated by the selected crossbar configuration 410(a-n), such output voltages may be selected by the output selector 440 and provided to the training unit 470. The training unit 470 may then determine the difference in the output voltages from a threshold of output voltages and thereby determine how each weight for each resistive memory is to be adjusted in order to improve the selected resistive memory crossbar configuration 410(a-n) with regard to properly identifying an image.

In an embodiment, the derivative calculating block 460 may store values that correspond to the derivative of the function represented by the output voltages generated by the selected resistive memory crossbar configuration 410(a-n), such as a sigmoid function. The derivative calculating block 460 may compress the output voltages that represent the sigmoid function to digital output values of "0" or "1" based on the derivative of the sigmoid function. In doing so, the derivative calculating block 460 in providing the slope of the curve of the sigmoid function for each of the output voltages generated by the selected resistive memory crossbar configuration 410(a-n) may assist in the training unit 470 in optimizing the adjusted weights for each resistive memory included in the selected resistive memory crossbar configuration 410(a-n). The derivative calculating block 460 may be a look-up table and/or any other type of derivative calculating component that is able to compress the output voltages of the selected resistive memory crossbar configuration 410(a-n) to digital values based on the derivative of the function represented by the output voltages that will be apparent to those skilled in the art relevant art(s) without departing from the spirit and scope of the disclosure.

Figure 8:
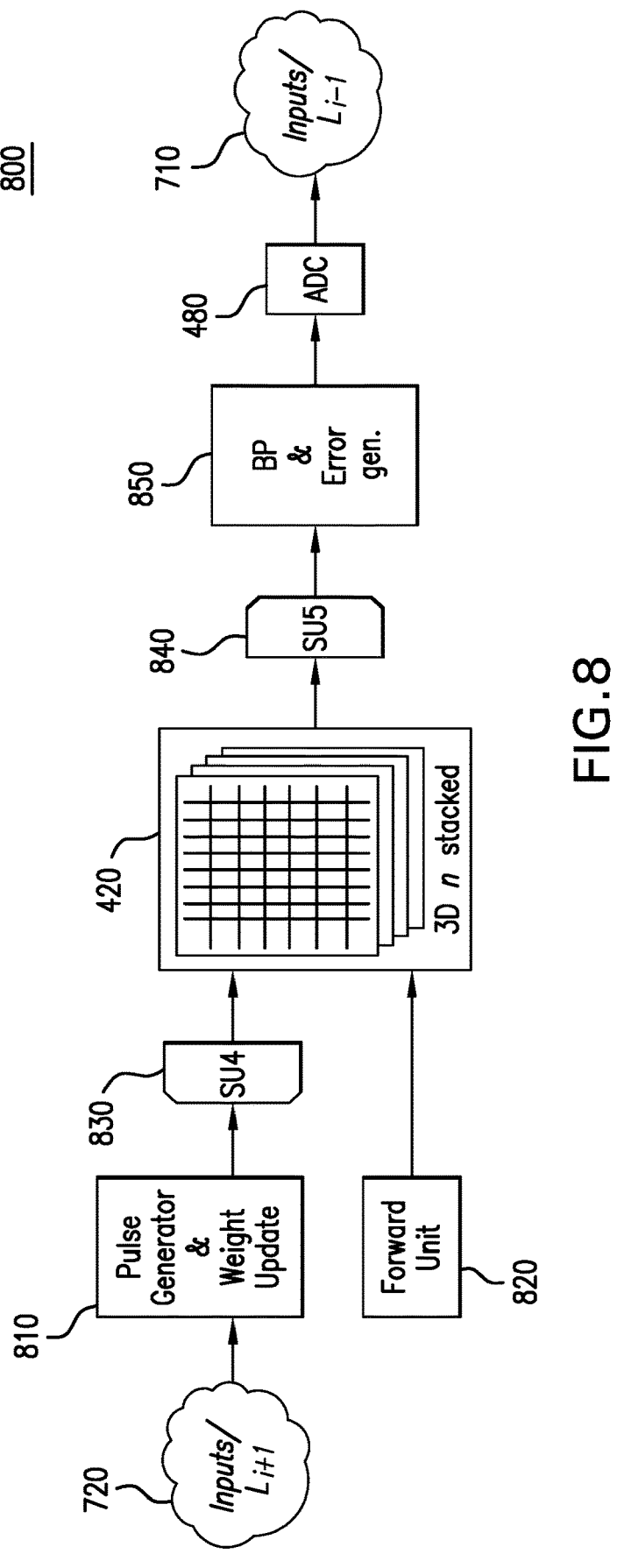
FIG. 8 is a schematic illustration of a detailed training architecture configuration that may be implemented in the analog neuromorphic circuit configuration of FIG. 4 in accordance with an embodiment of the disclosure.

Referring to FIG. 8, in which like reference numerals are used to refer to like parts, a detailed training architecture configuration 800 is shown. The training architecture configuration 800 shares many similar features with the analog neuromorphic processing device 100, the analog neuromorphic circuit 200, the neural network configuration 300, the analog neuromorphic 3D circuit configuration 400, the first input selector configuration 500, the second input selector configuration 600, and the recognition architecture configuration 700; therefore, only the differences between the training architecture configuration 800 and the analog neuromorphic processing device 100, the analog neuromorphic circuit 200, the neural network configuration 300, the analog neuromorphic 3D circuit configuration 400, the first input selector configuration 500, the second input selector configuration 600, and the recognition architecture configuration 700 are to be discussed in more detail.

As discussed above the training architecture configuration 800 may be activated via the training unit 470 in which the resistive memories positioned in the selected resistive memory crossbar configuration 410(a-n) may be adjusted based on the output voltages generated by the selected resistive memory crossbar configuration 410(a-n) in comparison to the threshold of output voltages that represents the correct outcome to the request applied to the analog neuromorphic 3D circuit configuration 400. The training architecture configuration 800 may execute training algorithms such as those disclosed with regard to supervised learning as discussed in detail in U.S. Pat. No. 11,954,588 B2 which is incorporated by reference in its entirety. The training architecture configuration 800 may also execute training algorithms such as those disclosed with regard to unsupervised learning as discussed in detail in U.S. Pat. No. 12,367,385 B2 which is incorporated by reference in its entirety. The training architecture configuration 800 may also execute training algorithms such as those disclosed with regard to back propagation as discussed in detail in U.S. Pat. No. 11,748,609 B2 which is incorporated by reference in its entirety. The training architecture configuration 800 may also incorporate any other training algorithms and/or architecture that may be implemented by an analog neuromorphic 3D circuit configuration that will be apparent to those skilled in the art relevant art(s) without departing from the spirit and scope of the disclosure.

The output data 720 may represent the output voltages generated from a previous resistive memory crossbar configuration 410(a-n) in which input data 710 was previously applied as input voltages to the previous resistive memory crossbar configuration 410(a-n) and was previously propagated through the previous resistive memory crossbar configuration 410(a-n) thereby generating output voltages as represented by the output data 720. With regard to the analog neuromorphic 3D circuit configuration 400 that includes several resistive memory crossbar configurations 410(a-n) positioned in the 3D stack 420, a forward unit 820 may provide the output data 720 previously generated from a previous resistive memory crossbar configuration 410(a-n) as input data 710 that is applied as input voltages to the next resistive memory crossbar configuration 410(a-n) that are to propagate through the next resistive memory crossbar configuration 410(a-n) thereby generating output voltages represented by the output data 720.

For example, resistive memory crossbar configuration 410d is selected to have input data 710 applied to the resistive memory crossbar configuration 410d that is then converted to input voltages by the shared peripheral circuitry for the 3D stack 420 and provided to the selected resistive memory crossbar configuration 410d. The selected resistive memory crossbar configuration 410d then propagates the input voltages through the resistive memories included in the selected resistive memory crossbar configuration 410d thereby generating output voltages. The output voltages are then converted to output data 720 by the shared peripheral circuitry for the 3D stack 420. The forward unit 820 then provides the output data 720 to the resistive memory crossbar configuration 410e as input data 710 which is the next resistive memory crossbar configuration selected to propagate input voltages that corresponds to the input data 710 to generate output voltages that is converted to output data 720 and then provided to the next resistive memory crossbar configuration 410(*a-n*) as input 710 by the forward unit 820 and so on.

With regard to the training architecture configuration 800, the forward unit 820 may provide the output data 720 which represents the output voltages generated by the previous resistive memory crossbar configuration 410(*a-n*) to the pulse generator and weight update 810. The output data 720 provided to the pulse generator and weight update 810 by the forward unit 820 is to be input data 710 that is then converted to input voltages and applied to the selected resistive memory crossbar configuration 410(*a-n*) in the 3D stack 420 and propagated through by selected resistive memory crossbar configuration 410(*a-n*) thereby generating output voltages that is then converted to output data 720.

The pulse generator and weight update 810 may be included in the peripheral circuitry of the analog neuromorphic 3D circuit configuration 400 that is shared by the resistive memory crossbar configurations 410(*a-n*) positioned in the 3D stack 420. The pulse generator and weight update 810 may generate pulses that represent the updated weights in which the resistive memories included in the selected resistive memory crossbar configuration 410(*a-n*) are to be updated. The weight update selector unit 830 may then select the resistive memory crossbar configuration 410(*a-n*) positioned in the 3D stack 420 that is selected by the control unit 405 as the memory crossbar configuration 410(*a-n*) that is to have the output data 720 generated from the previous resistive memory crossbar configuration 410(*a-n*) provided as input data 710 to the selected resistive memory crossbar configuration 410(*a-n*) by the forward unit 820. After the weight update selector unit 830 selects the resistive memory crossbar configuration 410(*a-n*) as instructed by the control unit 405, the pulse generator and weight update 830 may provide the pulses to the selected resistive memory crossbar configuration 410(*a-n*) to update the weights of the resistive memories included in the selected resistive memory crossbar configuration 410(*a-n*). The output data 720 generated by the previous resistive memory crossbar configuration 410(*a-n*) may be converted to input voltages and applied to the selected resistive memory crossbar configuration 410(*a-n*) as discussed in detail above.

The input voltages may then be applied to the selected resistive memory crossbar configuration 410(*a-n*) and may propagate through the resistive memories included in the selected resistive memory crossbar configuration 410(*a-n*) with the updated weights provided by the pulse generator and weight update 810. The selected resistive memory crossbar configuration 410(*a-n*) may then generate the output voltages based on the updated weights of the resistive memories included in the selected resistive memory crossbar configuration 410(*a-n*). The back propagation selector unit 840 may then select the selected resistive memory crossbar configuration 410(*a-n*) with the output voltages generated by the updated weights of the resistive memories. The output voltages generated by the selected resistive memory crossbar configuration 410(*a-n*) as selected by the back propagation selector unit 840 may then be provided to the back propagation and error generation 850.

The back propagation and error generation 850 may be included in the peripheral circuitry of the analog neuromorphic 3D circuit configuration 400 that is shared by the resistive memory crossbar configurations 410(*a-n*) positioned in the 3D stack 420. The back propagation and error generation 850 may compare the output voltages to the threshold of output voltages in order to determine the difference between the output voltages and the threshold of output voltages. In doing so, the back propagation and error generation 850 may generate signals that represent the error difference between the output voltages and the threshold of output voltages. The output voltages generated by the selected resistive memory crossbar configuration 410(*a-n*) may be provided to the ADC 480 and converted to digital data resulting in output data 720 as discussed in detail above. The signals generated by the back propagation and error generation 850 may also be provided to the ADC 480.

The back propagation and error generation 850 may be activated via the training unit 470 in which the training of the selected analog neuromorphic resistive memory configuration 410(*a-n*) is activated. In doing so, the output data 720 that represents the output voltages generated by the selected resistive memory crossbar configuration 410(*a-n*) is instead input data 710 in which the output data 720 that represents the output voltages generated by the selected resistive memory crossbar configuration 410(*a-n*) is back propagated back into the training architecture configuration 800 as input data 710 that represents the input voltages that are to be back propagated back into the inputs of the selected resistive memory crossbar configuration 410(*a-n*). The signals generated by the back propagation and error generation 850 may also be back propagated and provide to the pulse generator and weight update 810 in order for the pulse generator and weight update 810 to update the signals generated by the pulse generator and weight update 810 to update the weights of the resistive memories included in the selected resistive memory crossbar configuration 410(*a-n*) based on the signals generated by the back propagation and error generation 850. As a result, the resistive memories included in the selected resistive memory crossbar configuration 410(*a-n*) may continue to be trained to improve the accuracy of the potential outcome generated by the output voltages of the selected resistive memory crossbar configuration 410(*a-n*) while minimizing the amount of peripheral circuitry due to the shared peripheral circuitry included in training architecture configuration 800 for the 3D stack 420.

An analog neuromorphic circuit may include a plurality of processing cores with each core including a plurality of resistive memory crossbar configurations 410(*a-n*) with each corresponding resistive memory crossbar configuration 410(*a-n*) positioned in each corresponding core in a stack thereby forming a three-dimensional (3D) stack of a plurality of resistive memory crossbar configurations included each corresponding core. The analog neuromorphic circuit includes a plurality of input selector units with each selector unit shared by a corresponding processing core and each input selector unit may select a selected resistive memory crossbar configuration positioned in each corresponding processing core that a plurality of input voltages is to be applied. The analog neuromorphic circuit includes a plurality of output selector units with each output selector unit shared by a corresponding processing core. Each output selector unit is configured to select the selected resistive memory crossbar configuration positioned in each corresponding processing core that a plurality of output voltages is generated. The analog neuromorphic circuit includes a plurality of activation units with each activation unit shared by a corresponding processing core. Each activation unit may receive the plurality of output voltages generated from each corresponding selected resistive crossbar configuration and execute a function based on the plurality of output voltages received from the corresponding selected resistive memory crossbar configuration.

As discussed above with regard to the forward unit 820 routing input data 710 and/or output data 720 to different resistive memory crossbar configurations 410(*a-n*) positioned in the 3D stack 420, a router 435 may route input data and/or output data between cores. Each 3D stack 420 of resistive memory crossbar configurations 410(*a-n*) and the corresponding peripheral circuitry may be included in a core. In doing so, each core includes peripheral circuitry that is shared by the resistive memory crossbar configurations 410(*a-n*) included in the 3D stack 420 for that core. As input data and/or output data is generated by each core, the router 435 may then route such input data and/or output data to the appropriate core. Each core then operates as discussed in detail above with regard to the peripheral circuitry and the resistive memory crossbar configurations 410(*a-n*) included in the 3D stack 420 for each particular core.

The router may route output data from each processing core to a corresponding processing core and apply as input data to the corresponding processing core. The router may route the output data 720 that is represented by a plurality of output voltages generated by each corresponding output of a last selected resistive memory crossbar configuration 410 (*a-n*) positioned in a first 3D stack 420 of a first processing core to a first selected resistive memory crossbar configuration positioned in a second 3D stack of a second processing core and applied to the first selected resistive memory crossbar as the input data represented by a plurality of input voltages applied to each corresponding input of the first selected resistive memory crossbar configuration.

For example a previous core 445 may generate output data that is then routed to a current core by the router 435 and presented to the current core as input data 710. The current core may then process the input data 710 with the peripheral circuitry included in the current core and shared by the resistive memory crossbar configurations 410(*a-n*) positioned in the 3D stack 420 as discussed in detail above. The resistive memory crossbar configurations 410(*a-n*) positioned in the 3D stack 420 may then generate output data 720 that is then routed to the next core 455 by the router 435 in which the router 435 provides the output data 720 generated by the current core as input data to the next core 455. The next core 455 then processes the input data as discussed in detail above.

Figure 9:
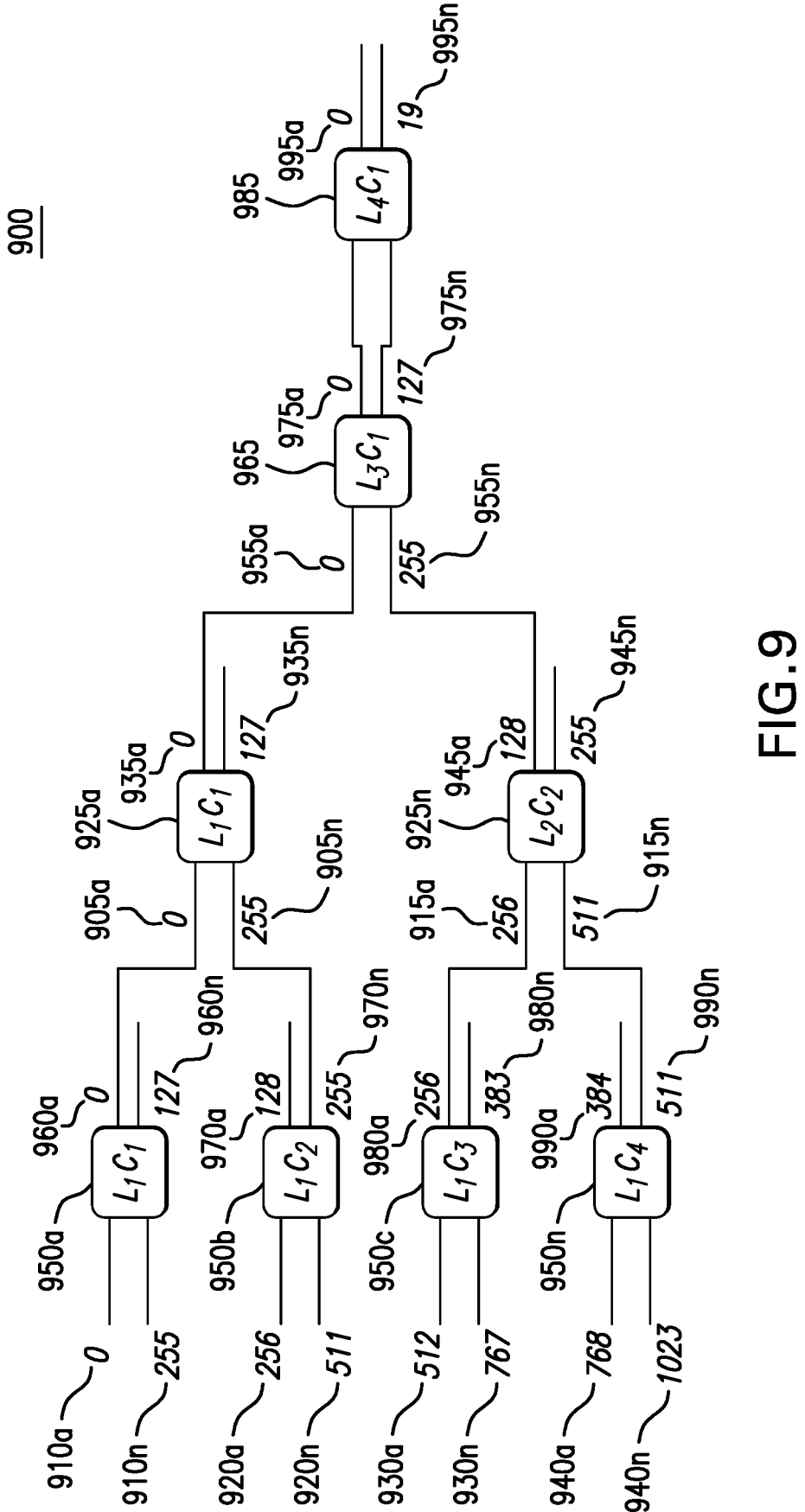
FIG. 9 is a schematic illustration of a detailed resistive memory crossbar mapping configuration that may be implemented in the analog neuromorphic circuit configuration of FIG. 4 in accordance with an embodiment of the disclosure.

Referring to FIG. 9, in which like reference numerals are used to refer to like parts, a detailed resistive memory crossbar mapping configuration 900 is shown. The resistive memory crossbar mapping configuration 900 shares many similar features with the analog neuromorphic processing device 100, the analog neuromorphic circuit 200, the neural network configuration 300, the analog neuromorphic 3D circuit configuration 400, the first input selector configuration 500, the second input selector configuration 600, the recognition architecture configuration 700, and the training architecture configuration 800; therefore, only the differences between the resistive memory crossbar mapping configuration 900 and the analog neuromorphic processing device 100, the analog neuromorphic circuit 200, the neural network configuration 300, the analog neuromorphic 3D circuit configuration 400, the first input selector configuration 500, the second input selector configuration 600, the recognition architecture configuration 700, and the training architecture configuration 800 are to be discussed in more detail.

A neural network that is to be incorporated into a resistive memory crossbar configuration may have inputs that are so numerous that such a neural network cannot be implemented into a resistive memory crossbar configuration due to the feasibility of optimizing processing and performance. For example, an image that is to be recognized by the resistive memory crossbar configuration may include 1024 pixels that corresponds to 1024 inputs for a single resistive memory crossbar configuration. Although the single resistive memory crossbar configuration could be generated to have 1024 inputs, the feasibility of optimizing processing and performance may be better satisfied by incorporating several resistive memory crossbar configurations to handle the request that has a significant amount of inputs.

In doing so, the significantly amount of inputs may be broken up into portions and applied to individual resistive memory crossbar configurations with each resistive memory crossbar configuration having a corresponding weight matrix that is applied to each corresponding portion of inputs. Each of the restive memory crossbar configurations may then have outputs that are a linear decrease from the portion of inputs applied to each of the resistive memory crossbar configurations. As a result, the outputs of each of the resistive memory crossbar configurations is less than the inputs applied to each of the resistive memory crossbar configurations. A second layer of resistive memory crossbar configurations may then receive the reduced quantity of outputs of the first layer of resistive memory crossbar configurations as compared to the inputs initially applied to each of the resistive memory crossbar configurations.

Each of the resistive memory crossbar configurations included in the second layer may also have a corresponding weight matrix that is applied to each of the corresponding inputs that are portions of the reduced quantity of outputs of the first layer of resistive memory crossbar configurations. The outputs of each of the resistive memory crossbar configurations in the second layer are less than the inputs of each of the resistive memory crossbar configurations in the second layer which were previously reduced from the initial significant quantity of inputs applied to the first layer of resistive memory crossbar configurations. The outputs of each resistive memory crossbar configuration in the second layer which are reduced from the quantity of inputs applied to each resistive memory crossbar configuration in the second layer may then be applied to additional layers in a similar manner until the outputs of the final layer of resistive memory crossbar configurations generates the quantity of outputs required by the initial request.

For example, a request may include the identification of a 1024 pixel image in which the request requires twenty different identifications. In doing so, the request requires 1024 inputs to be applied to a resistive memory crossbar configuration and generate 20 outputs. Such a significant amount of inputs with a significant decrease in outputs may be applied to a single resistive memory crossbar configuration. However, breaking the request into several layers of resistive memory crossbar configurations may provide increased optimization in processing and efficiency of the request.

In such an example, the 1024 inputs that represent the 1024 pixels included in the image that is to be identified may be broken up into portions of inputs. The portions of inputs may be broken up into portions that include 256 inputs each with each portion of 256 inputs applied to a resistive memory crossbar configuration with each resistive memory crossbar configuration having a weighted matrix. Each weighted matrix for each resistive memory crossbar configuration may then be applied to each portion of inputs applied to each corresponding resistive memory crossbar configuration. In such an example, 256 inputs 910(*a-n*), where n is an integer equal to 256 is applied to the resistive memory crossbar configuration with weight matrix 950*a*. In such an example, 256 inputs 920(*a-n*), where n is an integer equal to 256 is applied to the resistive memory crossbar configuration with weight matrix 950*b*. In such an example, 256 inputs 930(*a-n*), where n is an integer equal to 256 is applied to the resistive memory crossbar configuration with weight matrix 950*c*. In such an example, 256 inputs 940(*a-n*), where n is an integer equal to 256 is applied to the resistive memory crossbar configuration with weight matrix 950*n*, where n is an integer that is equal to the quantity of resistive memory crossbar configurations included in the first layer.

Each of the resistive memory crossbar configurations in the first layer then generate outputs that reduce the initial quantity of inputs of 256 inputs to 128 outputs. In such an example, resistive memory crossbar configuration in the first layer generates 128 outputs 960(*a-n*), 128 outputs 970(*a-n*), 128 outputs 980(*a-n*), and 128 outputs 990(*a-n*), where n is an integer equal to 128, respectively. Each of the 128 outputs in 960(*a-n*), 970(*a-n*), 980(*a-n*), and 990(*a-n*) are then consolidated and applied to a third layer of resistive memory crossbar configurations with each resistive memory crossbar configuration in the third layer having 256 inputs. As a result, outputs 960(*a-n*) and 970(*a-n*) are consolidated and applied as 256 inputs 905(*a-n*), where n is an integer equal to 256. Outputs 970(*a-n*) are consolidated and applied as 256 inputs 915(*a-n*), where n is an integer equal to 256. Weight matrix 925*a* is then applied to the 256 inputs 905(*a-n*) and weight matrix 925*n* is then applied to the 256 inputs 915 (*a-n*), where n is an integer that equals the quantity of resistive memory crossbar configurations included in the second layer of resistive memory crossbar configurations.

As with the first layer of resistive memory crossbar configurations to the second layer of resistive memory crossbar configurations, the inputs of the second layer of resistive memory crossbar configurations are again reduced with the outputs of the second layer of resistive memory crossbar configurations. In doing so, 256 inputs 905(*a-n*) are reduced to 128 outputs 935(*a-n*) where n is an integer equal to 128 and 256 inputs 915(*a-n*) are reduced to 128 outputs 945(*a-n*). The 128 outputs 935(*a-n*) and the 128 outputs 945(*a-n*) are then grouped together and applied to the third layer for resistive memory crossbar configurations as 256 inputs 955(*a-n*) in which the weighted matrix 965 is applied to the 256 inputs 955(*a-n*) thereby generating 128 outputs 975(*a-n*), where n is an integer equal to 128. As noted above, the requested predictive outcomes for the identity the image of 1028 pixels is 20. As a result, the 128 outputs 975(*a-n*) are then applied as inputs into the fourth layer of resistive memory crossbar configurations with the weighted matrix 985 thereby generating the 20 outputs 995(*a-n*), where n is an integer equal to 20, and represents the 20 different identifications of the 1024 pixel image.

It is to be appreciated that the Detailed Description section, and not the Abstract section, is intended to be used to interpret the claims. The Abstract section can set forth one or more, but not all exemplary embodiments, of the present disclosure, and thus, is not intended to limit the present disclosure and the appended claims in any way.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in art.

The invention in its broader aspects is therefore not limited to the specific details, representative apparatus and method and illustrative examples shown and described. Accordingly, departures may be made from such details without departing from the scope of the general inventive concept.

What is claimed is:

1. An analog neuromorphic circuit that implements a plurality of resistive memories, comprising:

a plurality of resistive memory crossbar configurations with each resistive memory crossbar configuration positioned in the analog neuromorphic circuit in a stack thereby forming a three-dimensional (3D) stack of the plurality of resistive memory crossbar configurations;

a plurality of input voltages applied to an input selector unit and the input selector unit is configured to select a first selected resistive memory crossbar configuration that the plurality of input voltages is to be applied, wherein each input voltage corresponds to a corresponding input of the first selected resistive memory crossbar configuration positioned in the 3D stack as first selected by the input selector unit;

a plurality of output voltages generated by the first selected resistive memory crossbar configuration from a propagation of the input voltages through a plurality of resistive memories positioned on the first selected resistive memory crossbar configuration;

an output selector unit configured to select the first selected resistive memory crossbar configuration that the plurality of output voltages is generated from, wherein each output voltage corresponds to a corresponding output of the first selected resistive memory crossbar configuration positioned in the 3D stack as selected by the output selector; and an activation function unit that is configured to receive the plurality of output voltages generated from the first selected memory crossbar configuration and to execute a function based on the plurality of output voltages received from the first selected resistive memory crossbar configuration.

2. The analog neuromorphic circuit of claim 1, wherein the activation function unit is further configured to:

execute a recognition function that generates a plurality of potential outcomes based on the output voltages generated by the first selected resistive memory crossbar configuration, wherein each of the plurality of potential outcomes is a potential outcome to a request that includes input data that is applied to the first selected resistive memory crossbar configuration as input data.

3. The analog neuromorphic circuit of claim 1, wherein the analog neuromorphic circuit further comprises:

a plurality of peripheral circuitry that is configured to assist the plurality of resistive memory crossbar configurations positioned in the 3D stack in the execution of the function based on the plurality of input voltages applied to each selected resistive memory crossbar configuration thereby generating the output voltages for each selected resistive memory crossbar configuration, wherein the plurality of peripheral circuitry is shared by each resistive memory crossbar configuration positioned in the 3D stack thereby eliminating peripheral circuitry that is redundant and implemented by each resistive memory crossbar configuration rather than shared by each resistive memory crossbar configuration.

4. The analog neuromorphic circuit of claim 3, wherein the plurality of peripheral circuitry comprises:

a training unit configured to propagate back into the first selected resistive memory crossbar configuration a plurality of adjusted resistance values for each corresponding resistive memory positioned in the first selected resistive memory crossbar configuration based on a comparison of the output voltages generated by the first selected resistive memory crossbar configuration to a plurality of threshold output voltages to train the first selected resistive memory crossbar configuration, wherein the threshold output voltages identify a correct outcome to the request.

5. The analog neuromorphic circuit of claim 3, wherein the analog neuromorphic circuit further comprises:

a control unit configured to:

instruct the input selector unit to select a second selected resistive memory crossbar configuration positioned in the 3D stack that a second plurality of input voltages is to be applied thereby enabling the input selector unit to select each resistive memory crossbar configuration; and instruct the output selector unit to select the second selected resistive memory crossbar configuration that a second plurality of output voltages is generated from thereby enabling the first selected resistive memory crossbar configuration and the second resistive memory crossbar configuration to share each of the peripheral circuitry included in the analog neuromorphic circuit.

6. The analog neuromorphic circuit of claim 3, wherein the plurality of peripheral circuitry further comprises:

a digital to analog converter (DAC) configured to convert a digital signal that includes at least one bit to the plurality of input voltages that is to be applied to the first selected resistive memory crossbar configuration positioned in the 3D stack as selected by the input selector unit and apply the converted input voltages to each corresponding input of the first selected resistive memory crossbar.

7. The analog neuromorphic circuit of claim 3, wherein the plurality of peripheral circuitry further comprises:

an analog to digital converter (ADC) configured to convert the plurality of output voltages generated by the first selected resistive memory crossbar configuration positioned in the 3D stack as selected by the output selector to an output digital signal and provide to the activation unit to execute a function based on the plurality of output voltages received from the first selected memory crossbar configuration.

8. The analog neuromorphic circuit of claim 3, wherein the input selector unit is further configured to select a second selected resistive memory crossbar configuration positioned in the 3D stack that a second plurality of input voltages is to be applied thereby enabling the input selector unit to select each resistive memory configuration as instructed by a control unit.

9. The analog neuromorphic circuit of claim 8, wherein the output selector unit is further configured to select the second selected resistive memory crossbar configuration that a second plurality of output voltages is generated from thereby enabling the first selected resistive memory crossbar configuration and the second resistive memory configuration to share each of the peripheral circuitry included in the analog neuromorphic circuit as instructed by the control unit.

10. A method for implementing a three-dimensional (3D) stack of a plurality of resistive memory crossbar configurations into an analog neuromorphic circuit, comprising:

providing a plurality of resistive memory crossbar configurations with each resistive memory crossbar configuration positioned into the analog neuromorphic circuit in a stack thereby forming the 3D stack of the plurality of resistive memory crossbar configurations;

applying a plurality of input voltages applied to an input selector unit;

selecting by the input selector unit a first selected resistive memory crossbar configuration that the plurality of input voltages is applied, wherein each input voltage corresponds to a corresponding input of the first selected resistive memory crossbar configuration positioned in the 3D stack as first selected by the input selector unit;

generating a plurality of output voltages by the first selected resistive memory crossbar configuration from a propagation of the input voltages through a plurality of resistive memories positioned on the first selected resistive memory crossbar configuration;

selecting by an output selector the first selected resistive memory crossbar configuration that the plurality of output voltages is generated from, wherein each output voltage corresponds to a corresponding output of the first selected resistive memory crossbar configuration positioned in the 3D stack as selected by the output selector; and receiving by an activation unit the plurality of output voltages generated from the first selected memory crossbar configuration; and executing a function based on the plurality of output voltages received from the first selected memory crossbar configuration.

11. The method of claim 10, further comprising:

assisting the plurality of resistive memory crossbar configurations positioned in the 3D stack by a plurality of peripheral circuitry in the execution of the function based on the plurality of input voltages applied to each selected resistive memory crossbar configuration thereby generating the output voltages for each selected resistive memory configuration, wherein the plurality of peripheral circuitry is shared by each resistive memory crossbar configuration positioned in the 3D stack thereby eliminating peripheral circuitry that is redundant and implemented by each resistive memory crossbar configuration rather than shared by each resistive memory crossbar configuration.

12. The method of claim 11, further comprising:

propagating back into the first selected resistive memory crossbar configuration by a training unit that is included in the plurality of peripheral circuitry a plurality of adjusted resistance values for each corresponding resistive memory positioned in the first selected resistive memory crossbar configuration based on a comparison of the output voltages generated by the first selected resistive memory crossbar configuration to a plurality of threshold output voltages to train the first selected resistive memory crossbar configuration, wherein the threshold of output voltages identify a correct outcome to the request.

13. The method of claim 11, further comprising:

selecting by the input selector unit a second selected resistive memory crossbar configuration positioned in the 3D stack and a second plurality of input voltages that is to be applied thereby enabling the input selector unit to select each resistive memory crossbar configuration as instructed by a control unit; and

selecting by the output selector unit the second selected resistive memory crossbar configuration that a second plurality of output voltages is generated from thereby enabling the first selected resistive memory crossbar configuration and the second resistive memory crossbar configuration to share each of the peripheral circuitry included in the analog neuromorphic circuit.

14. The method of claim 11, further comprising:
converting by a digital to analog converter (DAC) included in the peripheral circuitry a digital signal that includes at least one bit to the plurality of input voltages that is to be applied to the first selected resistive memory crossbar configuration positioned in the 3D stack as selected by the input selector unit included in the peripheral circuitry and apply the converted input voltages to each corresponding input of the first selected resistive memory crossbar configuration.

15. The method of claim 11, further comprising:
converting by an analog to digital converter (ADC) included in the peripheral circuitry the plurality of output voltages generated by the first selected resistive memory crossbar configuration positioned in the 3D stack as selected by the output selector included in the peripheral circuitry to an output digital signal; and
providing the output digital signal to the activation unit to execute a function based on the plurality of output voltages received from the first selected memory crossbar configuration.

16. The method of claim 10, further comprising:
executing by the activation function unit that is included in the plurality of peripheral circuitry a recognition function that generates a plurality of potential outcomes based on the output voltages generated by the first selected resistive memory crossbar configuration, wherein each of the plurality of potential outcomes is a potential outcome to a request that includes input data that is applied to the first selected resistive memory crossbar configuration as input data.

17. An analog neuromorphic circuit that implements a plurality of resistive memories, comprising:
a plurality of processing cores with each processing core including a plurality of resistive memory crossbar configurations with each corresponding resistive memory crossbar configuration positioned in each corresponding processing core in a stack thereby forming a three-dimensional (3D) stack of plurality of resistive memory crossbar configurations included in each corresponding processing core;
a plurality of input selector units with each input selector unit shared by a corresponding processing core and each input selector unit is configured to select a selected resistive memory crossbar configuration positioned in each corresponding processing core that a plurality of input voltages is to be applied;
a plurality of output selector units with each output selector unit shared by a corresponding processing core and each output selector unit is configured to select the selected resistive crossbar configuration positioned in each corresponding processing core that a plurality of output voltages is generated from; and
a plurality of activation units with each activation unit shared by a corresponding processing core and each activation unit is configured to receive the plurality of output voltages generated from each corresponding selected resistive crossbar configuration and execute a function based on the plurality of output voltages received from the corresponding selected resistive memory crossbar configuration.

18. The analog neuromorphic circuit of claim 17, further comprising:
a router that is configured to route output data generated from each processing core to a corresponding processing core and apply as input data to the corresponding processing core.

19. The analog neuromorphic circuit of claim 18 wherein the router is further configured to:
route the output data that is represented by a plurality of output voltages generated by each corresponding output of a last selected resistive memory crossbar configuration positioned in a first 3D stack of a first processing core to a first selected resistive memory crossbar configuration positioned in a second 3D stack of second processing core and applied to the first selected resistive memory crossbar as the input data represented by a plurality of input voltages applied to each corresponding input of the first selected resistive memory crossbar configuration.

20. The analog neuromorphic circuit of claim 18, wherein the plurality of peripheral circuitry comprises:
a plurality of training units with each training unit shared by a corresponding processing core and each training unit configured to propagate back into each corresponding selected resistive memory crossbar configuration a plurality of adjusted resistance values for each corresponding resistive memory positioned in each corresponding selected resistive memory crossbar configuration based on a comparison of output voltages generated by each corresponding selected resistive memory crossbar configuration to a plurality of threshold output voltages to train each corresponding selected resistive memory crossbar configuration, wherein the threshold output voltages identify a correct outcome to the request.

21. The analog neuromorphic circuit of claim 17, further comprising:
a plurality of peripheral circuitry with each plurality of peripheral circuitry shared by a corresponding processing core and each plurality of peripheral circuitry is configured to assist each 3D stack of resistive memory crossbar configurations positioned in each corresponding processing core in the execution of each function of each corresponding resistive memory crossbar configuration positioned in each 3D stack, wherein each plurality of peripheral circuitry is shared by each resistive memory crossbar configuration positioned in each corresponding 3D stack thereby eliminating peripheral circuitry that is redundant for each corresponding 3D stack.

22. The analog neuromorphic circuit of claim 17, wherein each activation function unit is further configured to:
execute a recognition function that generates a plurality of potential outcomes based on the corresponding output voltages generated by each corresponding selected resistive memory crossbar configuration positioned in each corresponding processing core, wherein each of the plurality of outcomes is a potential outcome to a request that includes input data that is first applied to each corresponding selected resistive memory crossbar configuration as input data.

* * * * *